(12) United States Patent
Jou et al.

(10) Patent No.: US 9,715,131 B2
(45) Date of Patent: Jul. 25, 2017

(54) INTEGRATED FAN-OUT PACKAGE INCLUDING DIELECTRIC WAVEGUIDE

(71) Applicant: TAIWAN SEMICONDUCTOR MANUFACTURING CO., LTD., Hsinchu (TW)

(72) Inventors: Chewn-Pu Jou, Hsinchu (TW); Wen-Shiang Liao, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/010,816

(22) Filed: Jan. 29, 2016

(65) Prior Publication Data
US 2016/0147088 A1    May 26, 2016

Related U.S. Application Data

(63) Continuation-in-part of application No. 14/483,247, filed on Sep. 11, 2014, now Pat. No. 9,372,316.

(51) Int. Cl.
*G02F 1/035*   (2006.01)
*G02F 1/025*   (2006.01)
(Continued)

(52) U.S. Cl.
CPC .............. *G02F 1/025* (2013.01); *G02B 6/122* (2013.01); *G02B 6/1228* (2013.01); *G02B 6/132* (2013.01); *G02B 6/4274* (2013.01); *G02B 6/4298* (2013.01)

(58) Field of Classification Search
CPC ....... G02F 1/025; G02B 6/122; G02B 6/1228; G02B 6/132; G02B 6/4274; G02B 6/4298;
(Continued)

(56) References Cited

U.S. PATENT DOCUMENTS 8,009,941 B2    8/2011  Sigalas et al.
8,669,834 B2    3/2014  Cheng et al.
(Continued)

FOREIGN PATENT DOCUMENTS

CN    101622562 B    10/2011
JP    2009-033526 A    7/2007
(Continued)

OTHER PUBLICATIONS

M. Bozzi et al., "Review of substrate-integrated waveguide circuits and antennas," Published in IET Microwaves, Antennas & Propagation, IET Microw. Antennas Propag., 2011, vol. 5, Iss. 8, pp. 909-920.
(Continued)

*Primary Examiner* — Ellen Kim
(74) *Attorney, Agent, or Firm* — Maschoff Brennan

(57) ABSTRACT

A semiconductor structure and a method are disclosed herein. The semiconductor structure includes a dielectric waveguide vertically disposed between a first layer and a second layer, a driver die configured to generate, at a first output node, a driving signal, a first transmission electrode located along a first side of the dielectric waveguide and configured to receive the driving signal from the first output node, a first receiver electrode located along the first side of the dielectric waveguide, and a receiver die configured to receive a received signal from the first receiver electrode.

20 Claims, 23 Drawing Sheets

(51) Int. Cl.
*G02B 6/132* (2006.01)
*G02B 6/122* (2006.01)
*G02B 6/42* (2006.01)

(58) Field of Classification Search
CPC .......... H01G 2/20; H01G 4/005; H01G 5/011;
H01G 9/04; H01G 11/26
USPC ...... 385/2, 14, 131; 257/79, 83–84, 86, 100, 257/103
See application file for complete search history.

(56) References Cited

U.S. PATENT DOCUMENTS

| | | | |
|---|---|---|---|
| 8,680,647 B2* | 3/2014 | Yu | H01L 23/3192 257/528 |
| 8,755,662 B2* | 6/2014 | Kim | G02B 6/12 385/131 |
| 8,964,805 B2* | 2/2015 | Shen | 372/36 |
| 9,223,158 B2 | 12/2015 | Fujino et al. | |
| 9,236,485 B2* | 1/2016 | Oh | H01L 29/458 |
| 2002/0135543 A1* | 9/2002 | Kitamura | G02F 1/13452 345/55 |
| 2008/0012663 A1 | 1/2008 | Chung et al. | |
| 2011/0286694 A1 | 11/2011 | Wu et al. | |
| 2011/0309893 A1 | 12/2011 | Kawamura et al. | |
| 2012/0224804 A1* | 9/2012 | Hashimoto | G02B 6/4214 385/14 |
| 2013/0154756 A1 | 6/2013 | Reverdy et al. | |
| 2013/0234305 A1 | 9/2013 | Lin et al. | |
| 2013/0265734 A1 | 10/2013 | Herbsommer et al. | |
| 2014/0312987 A1 | 10/2014 | Morita et al. | |
| 2015/0295305 A1 | 10/2015 | Herbsommer et al. | |

FOREIGN PATENT DOCUMENTS

| | | |
|---|---|---|
| JP | 2011-248362 A | 12/2011 |
| KR | 10-2013-0103347 A | 9/2013 |
| WO | 2013/012023 A1 | 1/2013 |

OTHER PUBLICATIONS

Pending U.S. Appl. No. 14/692,794, filed Apr. 22, 2015.

* cited by examiner

INTEGRATED FAN-OUT PACKAGE INCLUDING DIELECTRIC WAVEGUIDE

REFERENCE TO RELATED APPLICATION

This application is a continuation-in-part of U.S. application Ser. No. 14/483,247 filed on Sep. 11, 2014, the contents of which are incorporated by reference in their entirety.

BACKGROUND

Integrated optical waveguides are often used as components in integrated optical circuits, which integrate multiple photonic functions. Integrated optical waveguides are used to confine and guide light from a first point on an integrated chip (IC) to a second point on the IC with minimal attenuation. Generally, integrated optical waveguides provide functionality for signals imposed on optical wavelengths in the visible spectrum.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
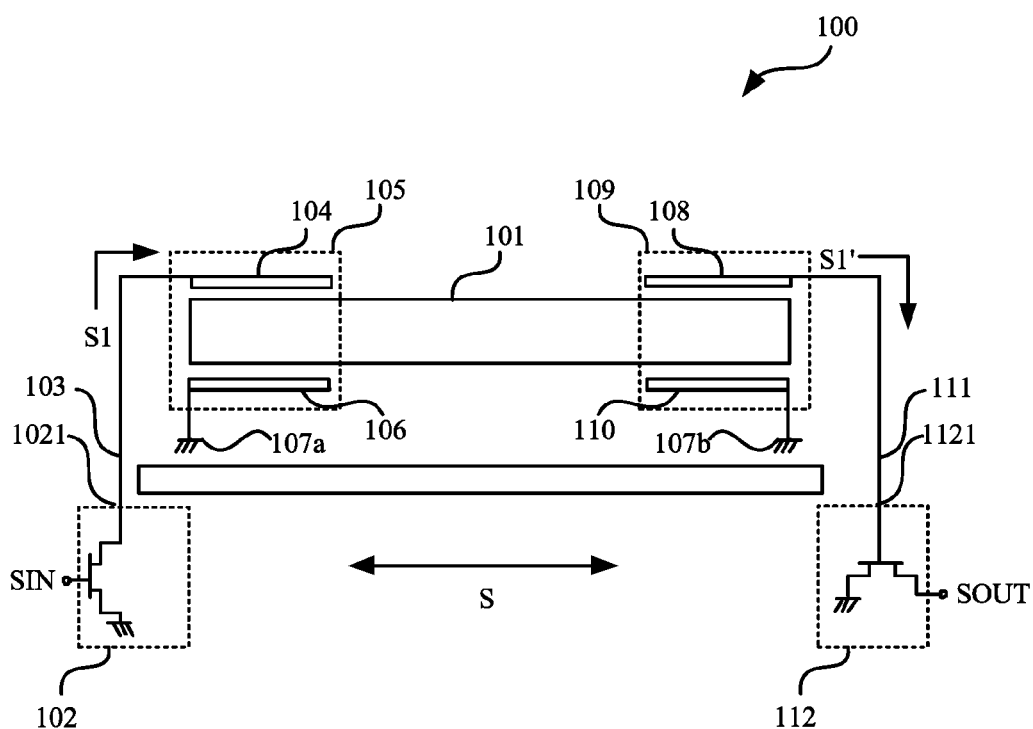
FIG. 1A is a schematic diagram of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Figure 1B:
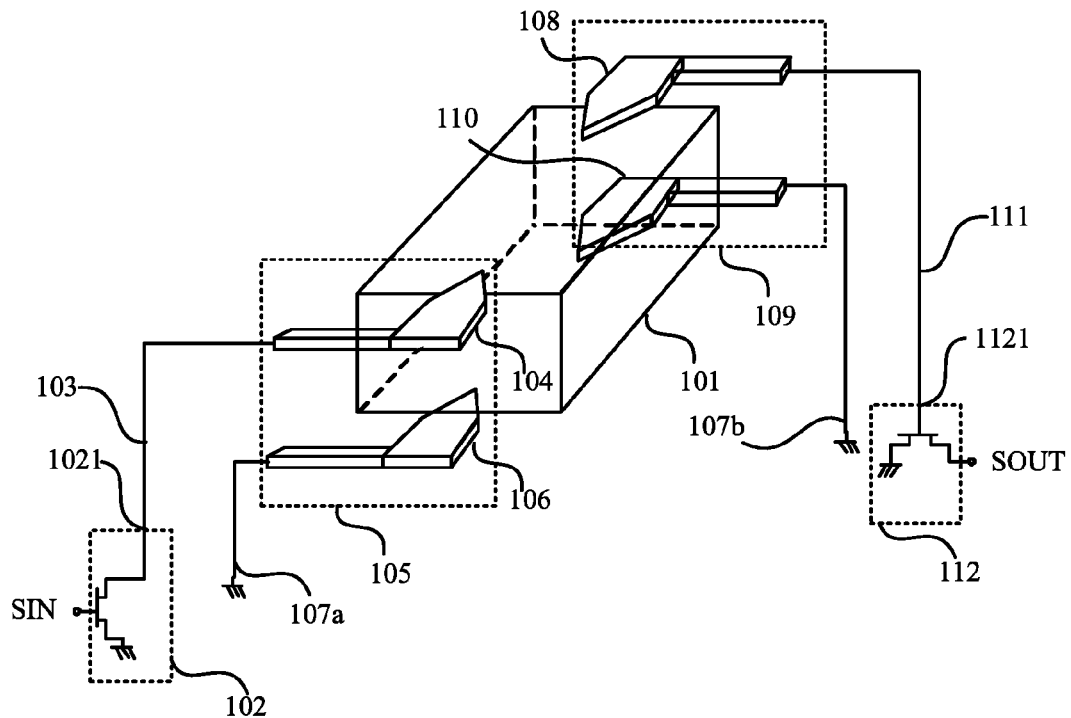
FIG. 1B is a three-dimensional (3D) view of the semiconductor structure as illustrated in FIG. 1A, in accordance with some embodiments of the present disclosure.

FIG. 1A is a schematic diagram of a semiconductor structure 100 in accordance with some embodiments of the present disclosure. FIG. 1B is a three-dimensional (3D) view of the semiconductor structure 100 as illustrated in FIG. 1A, in accordance with some embodiments of the present disclosure. As illustratively shown in FIG. 1A and FIG. 1B, the semiconductor structure 100 includes a dielectric waveguide 101 configured to convey a signal, a driver circuit 102, and a receiver circuit 112. In some embodiments, the signal conveyed through the dielectric waveguide 101 is a single ended signal. In some other embodiments, the signal conveyed through the dielectric waveguide 101 is a differential signal.

In some embodiments, the driver circuit 102 is configured to receive an input signal SIN, and output a transmission signal S1 at an output node 1021. The transmission signal S1 is provided to a transmission coupling element 105 by way of transmission lines 103. In some embodiments, the transmission coupling element 105 includes a pair of metal structures, including, for example, micro-strips, disposed on opposing sides of the dielectric waveguide 101. For illustration, the transmission coupling element 105 includes transmission electrodes 104 and 106 located on opposite sides of the dielectric waveguide 101. In some embodiments, the transmission electrodes 104 and 106 are symmetric with respect to the dielectric waveguide 101. In some embodiments, the shapes and/or patterns of the transmission electrodes 104 and 106 are mirror images.

For illustration in FIG. 1A, the transmission electrode 104 is located along a first side, for example, the upper side, of the dielectric waveguide 101. In some embodiments, the transmission electrode 104 is disposed along a top surface of the dielectric waveguide 101 within a metal interconnect layer, and is configured to receive the transmission signal S1 from the driver circuit 102.

The transmission electrode 104 is connected to the driver circuit 102 by way of the transmission line 103, in which the transmission line 103 provides for a wide bandwidth transmission of the transmission signal S1 from the driver circuit 102 to the transmission electrode 104. In some embodiments, the transmission electrode 104 is included within the transmission line 103.

The transmission electrode 106 is located along a second side, for example, the lower side, of the dielectric waveguide 101. In some embodiments, the transmission electrode 106 is disposed along a bottom surface of the dielectric waveguide 101 within another metal interconnect layer, and is connected to a ground terminal 107a.

The dielectric waveguide 101 is configured to transmit the transmission signal S1 to a receiver coupling element 109. The dielectric waveguide 101 is disposed within the interlevel dielectric (ILD) material, and the dielectric waveguide 101 includes a dielectric material having a dielectric constant (or permittivity) that is larger than that of the surrounding ILD material.

In some embodiments, the receiver coupling element 109 includes a pair of metal structures, including micro-strips, disposed on opposing sides of the dielectric waveguide 101. For illustration, the receiver coupling element 109 includes receiver electrodes 108 and 110 located on opposite sides of the dielectric waveguide 101. In some embodiments, the receiver electrodes 108 and 110 are symmetric with respect to the dielectric waveguide 101. In some embodiments, the shapes and/or patterns of the receiver electrodes 108 and 110 are mirror images.

The receiver electrode 108 is located along the first side, for example, the upper side, of the dielectric waveguide 101. In some embodiments, the receiver electrode 108 is disposed along the top surface of the dielectric waveguide 101 within the metal interconnect layer where the transmission electrode 104 is disposed, and is configured to receive the received signal S1', which are equivalent to the transmission signal S1, from the dielectric waveguide 101. The receiver electrode 108 is connected to the receiver circuit 112 by way of a transmission line 111. The transmission line 111 provides for a wide bandwidth transmission of the received signal S1' from the receiver electrode 108 to the receiver circuit 112.

The receiver electrode 110 is located along the second side, for example, the lower side, of the dielectric waveguide 101. In some embodiments, the receiver electrode 110 is disposed along the bottom surface of the dielectric waveguide 101 within the metal interconnect layer where the transmission electrode 106 is disposed, and is connected to a ground terminal 107b.

The first pair of metal structures is laterally separated from the second pair of metal structures by a space S so that the upper electrodes, 104 and 108, and the lower electrodes, 106 and 110, are non-continuous along a length of the dielectric waveguide 101. In some embodiments, the space S is on the order of microns to tens of millimeters.

In some embodiments, the receiver circuit 112 is configured to receive the received signal S1', and output an output signal SOUT at an output node 1121. The received signal S1' is transmitted from the receiver coupling element 109 by way of the transmission lines 111.

The greater dielectric constant of the dielectric waveguide 101 causes electromagnetic radiation introduced into the dielectric waveguide 101 to be confined within the dielectric waveguide 101 by total internal reflection, so that the electromagnetic radiation is guided from the driver circuit 102 to the receiver circuit 112. In some embodiments, the dielectric waveguide 101 includes silicon nitride (SiN) or silicon carbide (SiC). In some embodiments, the dielectric waveguide 101 includes room-temperature (e.g., 25° C.) liquid-phase high-K polymer, including, for example, polyimide (PI), polybenzoxazole (PBO), etc. In some other embodiments, the dielectric waveguide 101 includes room-temperature or low-temperature (e.g., below 250° C.) liquid-phase $SiO_2$ or Spin on Glass (SOG), of which the dielectric constant is greater than or equal to approximately 4. In some other embodiments, the dielectric waveguide 101 includes liquid phase SiN or other high-K dielectric. In some other embodiments, the dielectric waveguide 101 includes low-temperature (e.g., 180° C.) chemical vapor deposited $SiO_2$ (CVD-$SiO_2$), $SiN_x$ or $SiO_xN_y$ deposition, including, for example, atmospheric pressure CVD (APCVD), sub-atmospheric CVD (SACVD), plasma enhanced CVD (PECVD), metal organic CVD (MOCVD), etc. In some other embodiments, the dielectric waveguide 101 includes low-temperature (e.g., 210° C.) high-K dielectric deposition including, for example, $ZrO_2$—$Al_2O_3$—$ZrO_2$ (ZAZ) or other High-K dielectric deposition including, for example, $ZrO_2$, $Al_2O_3$, $HfO_x$, $HfSiO_x$, $ZrTiO_x$, $TiO_2$, $TaO_x$, etc. In some other embodiments, the dielectric waveguide 101 includes hybrid atomic layer deposited SrO (ALD-SrO) and chemical vapor deposited $RuO_2$ (CVD-$RuO_2$). For example, in some other embodiments, the dielectric waveguide 101 includes a $SrTiO_3$ (STO) dielectric layer.

The aforementioned materials are given for illustrative purposes. Various materials of the dielectric waveguide 101 are within the contemplated scoped of the present disclosure.

In some embodiments, the ILD material includes silicon dioxide ($SiO_2$). In other embodiments, the ILD material includes a low-k dielectric material, including, for example, fluorine-doped silicon dioxide, carbon-doped silicon dioxide, porous silicon dioxide, or a similar material.

Figure 2:
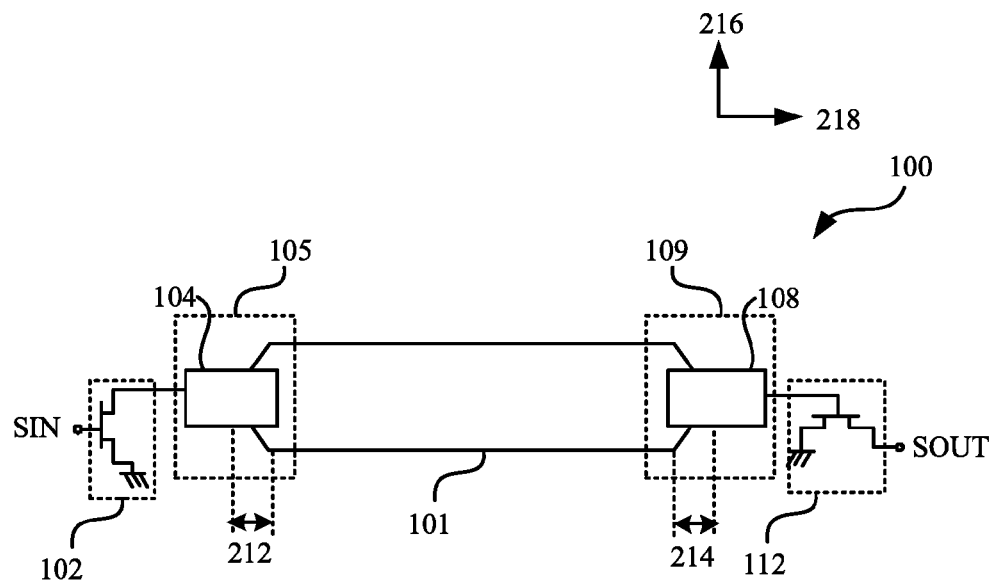
FIG. 2 is a side view of a semiconductor structure in accordance with some other embodiments of the present disclosure.

FIG. 2 is a side view of the semiconductor structure 100 in accordance with some embodiments of the present disclosure. In some embodiments, the dielectric waveguide 101 includes one or more tapered ends having widths w along direction 216 that gradually decrease. Alternatively stated, the widths decrease from a first width to a second narrower width over a length along direction 218 of a transition region. For example, the dielectric waveguide 101 includes a first tapered end, having a width that decreases over a transition region 212, and a second tapered end having a width that decreases over a transition region 214.

The tapered ends of the dielectric waveguide 101 are configured to increase efficiency by which electromagnetic radiation is coupled between the electrode 104 and/or the electrode 108, and the dielectric waveguide 101 by reducing the reflection of radiation between the electrode 104 and/or the electrode 108, and the dielectric waveguide 101. For illustration, the tapered transitional region changes the angle at which electromagnetic radiation interacts with sidewalls of the dielectric waveguide 101. Accordingly, the coupling of electromagnetic radiation between the electrode 104 and/or the electrode 108, and the dielectric waveguide 101, is increased, because total internal reflection is a function of an angle at which electromagnetic radiation is incident upon a surface.

Figure 3:
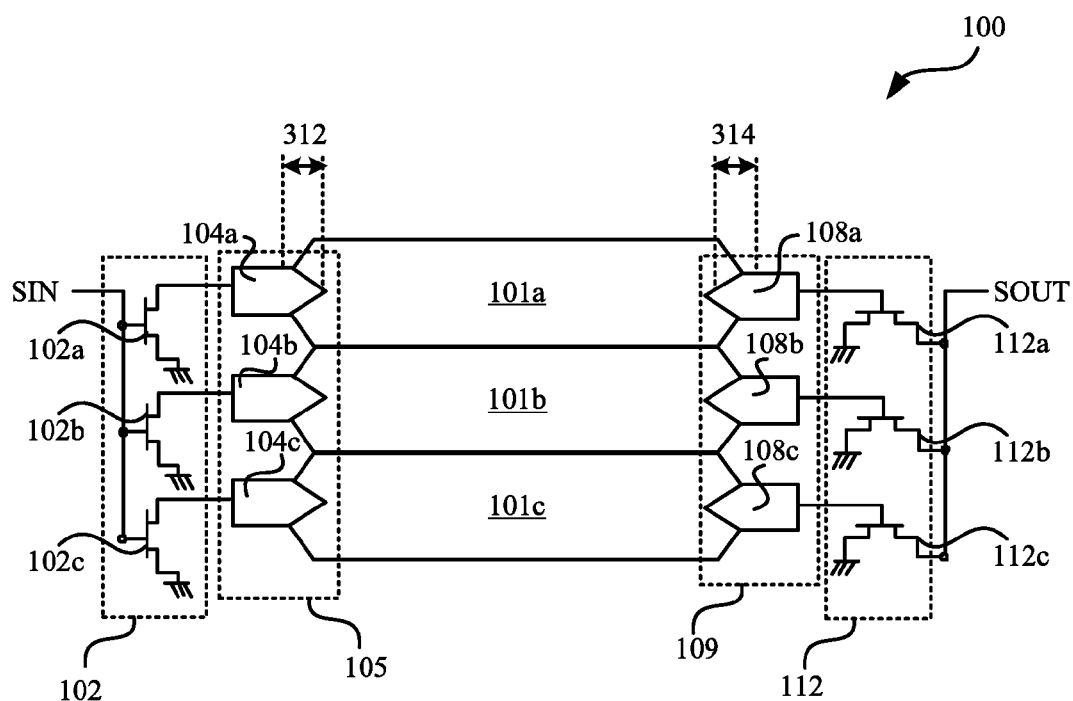
FIG. 3 is a top-view of the semiconductor structure as illustrated in FIG. 2 in accordance with some embodiments of the present disclosure.

FIG. 3 is a top-view of the semiconductor structure as illustrated in FIG. 2 in accordance with some embodiments of the present disclosure. The semiconductor structure 100 illustratively shown in FIG. 3 includes integrated dielectric waveguides 101a-101c configured to convey electromagnetic radiation in parallel.

In some embodiments, the semiconductor structure 100 includes dielectric waveguides 101a-101c disposed between the driver circuit 102 and the receiver circuit 112. In some embodiments, the dielectric waveguides 101a-101c are physically arranged in parallel to one another. In some embodiments, the waveguides 101a-101c abut one another. In some other embodiments, the dielectric waveguides 101a-101c are spatially separated from one another.

The driver circuit 102 includes separate driver elements, 102a-102c, which are each configured to generate an electrical signal. The electrical signal is provided in parallel to the transmission electrodes 104a-104c, which couple the electrical signal as electromagnetic radiation into the dielectric waveguides 101a-101c, which convey the signal in parallel. Since the electrical signals are transmitted in parallel, smaller amplitude signals are conveyed by each of the dielectric waveguides 101a-101c, thereby further decreasing loss between the transmission electrodes 104a-104c and the dielectric waveguides 101a-101c. Alternatively stated, the smaller amplitude signals output by the driver elements 102a-102c and received by the receiver elements 112a-112c cause the transmission coupling elements 105 and the receiver coupling elements 109 to experience less loss.

As illustratively shown in FIG. 3, in some embodiments, the electrodes 104a-104c and/or the electrodes 108a-108c, also or alternatively have tapered widths, to further increase coupling efficiency between the transmission coupling element 105 and/or the receiver coupling element 109, and the dielectric waveguide 101. In such embodiments, the electrodes 104a-104c and the electrodes 108a-108c, have widths that decrease over the transition regions, 312 and 314. In some embodiments, the tapered widths of the electrodes 104a-104c and the electrodes 108a-108c, are different in length. Alternatively stated, the electrodes 104a-104c and/or the electrodes 108a-108c have different sized transitional regions than the tapered widths of the dielectric waveguide 101.

Figure 4:
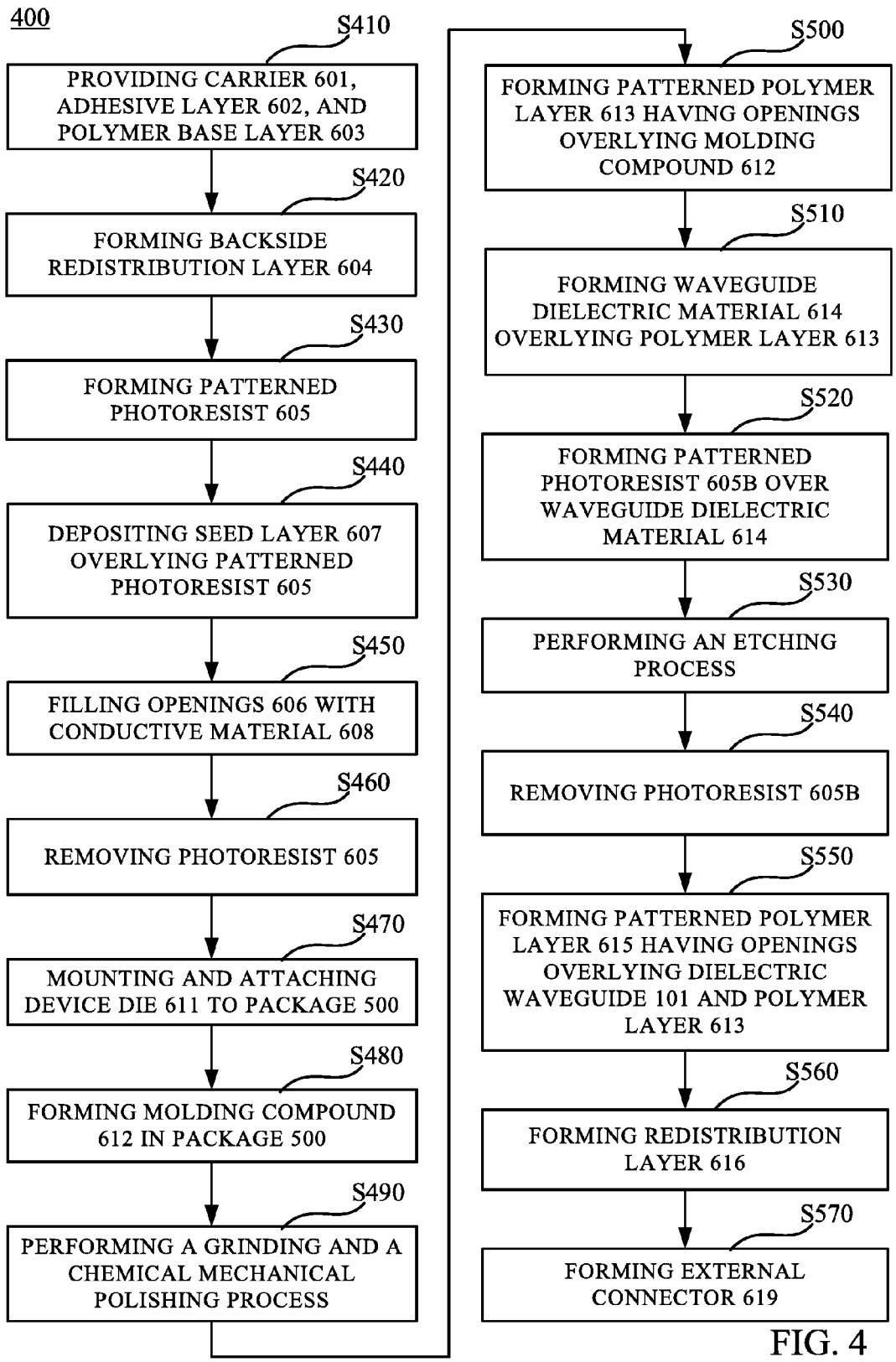
FIG. 4 is a flowchart illustrating a method 400 of forming an Integrated Fan-Out (InFO) package including the semiconductor structure as illustrated in FIG. 1A, in accordance with some embodiments of the present disclosure.

FIG. 4 is a flowchart illustrating a method 400 of forming an Integrated Fan-Out (InFO) package including the semiconductor structure 100 as illustrated in FIG. 1A, in accordance with some embodiments of the present disclosure. For better understanding of the present disclosure, the method 400 is discussed in relation to the semiconductor structure 100 shown in FIGS. 1-3, but is not limited thereto.

For illustration, the manufacturing process of the semiconductor structure 100 in FIGS. 1-3 is described by the method 400 together with FIGS. 5-24. FIGS. 5-24 are cross sectional views of the Integrated Fan-Out (InFO) package 500, including the semiconductor structure as illustrated in FIG. 1A, at different stages of a manufacturing process, in accordance with some embodiments of the present disclosure. Although FIGS. 5-24 are described together with the method 400, it will be appreciated that the structures disclosed in FIGS. 5-24 are not limited to the method 400. In some other embodiments, the Integrated Fan-Out (InFO) package 500 includes the semiconductor structure as illustrated in FIGS. 2-3.

While disclosed methods are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
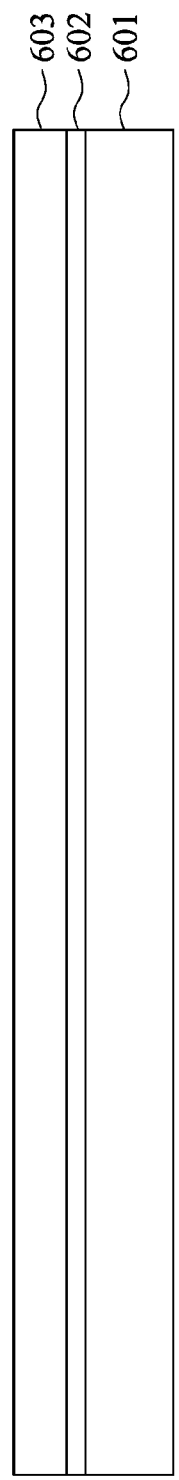
FIGS. 5-24 are cross sectional views of the Integrated Fan-Out (InFO) package, including the semiconductor structure as illustrated in FIG. 1A, at different stages of a manufacturing process, in accordance with some embodiments of the present disclosure.

With reference to the method 400 in FIG. 4, in operation 410, a carrier 601, an adhesive layer 602, and a polymer base layer 603 are provided, as illustrated in FIG. 5.

In some embodiments, the carrier 601 includes glass, ceramic, or other suitable material to provide structural support during the formation of various features in device package. In some embodiments, the adhesive layer 602, including, for example, a glue layer, a light-to-heat conversion (LTHC) coating, an ultraviolet (UV) film or the like, is disposed over the carrier 601. The polymer base layer 603 is coated on the carrier 601 via the adhesive layer 602. In some embodiments, the polymer base layer 603 is formed of PolyBenzOxazole (PBO), Ajinomoto Buildup Film (ABF), polyimide, BenzoCycloButene (BCB), Solder Resist (SR) film, Die-Attach Film (DAF), or the like, but the present disclosure is not limited thereto.

Figure 6:
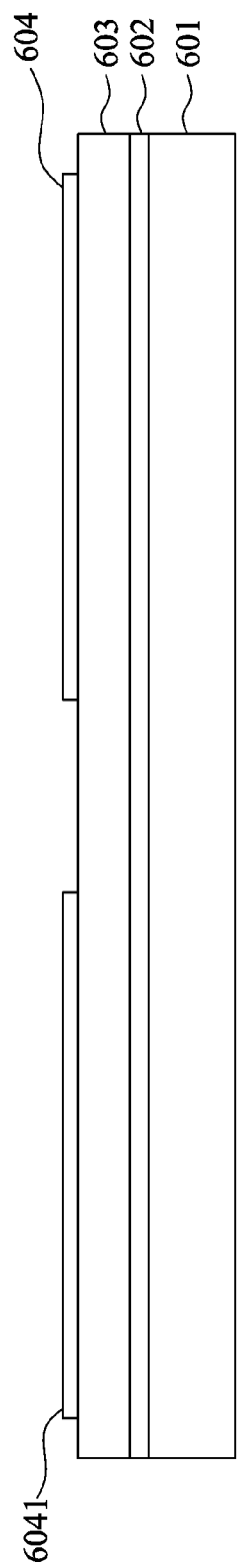

With reference to the method 400 in FIG. 4, in operation S420, subsequently, a backside redistribution layer (RDL) 604 is formed, as illustrated in FIG. 6. In some embodiments, RDL 604 includes conductive features 6041, including, for example, conductive lines and/or vias, formed in one or more polymer layers. In some embodiments, the polymer layers are formed of any suitable material, including PI, PBO, BCB, epoxy, silicone, acrylates, nano-filled pheno resin, siloxane, a fluorinated polymer, polynorbornene, or the like, using any suitable method, including, for example, a spin-on coating technique, sputtering, and the like.

In some embodiments, the conductive features 6041 are formed in polymer layers. The formation of such conductive features 6041 includes patterning polymer layers, for example, using a combination of photolithography and etching processes, and forming the conductive features 6041 in the patterned polymer layers, for example, depositing a seed layer and using a mask layer to define the shape of the conductive features 6041. The conductive features 6041 are designed to form functional circuits and input/output features for subsequently attached dies.

Figure 7:
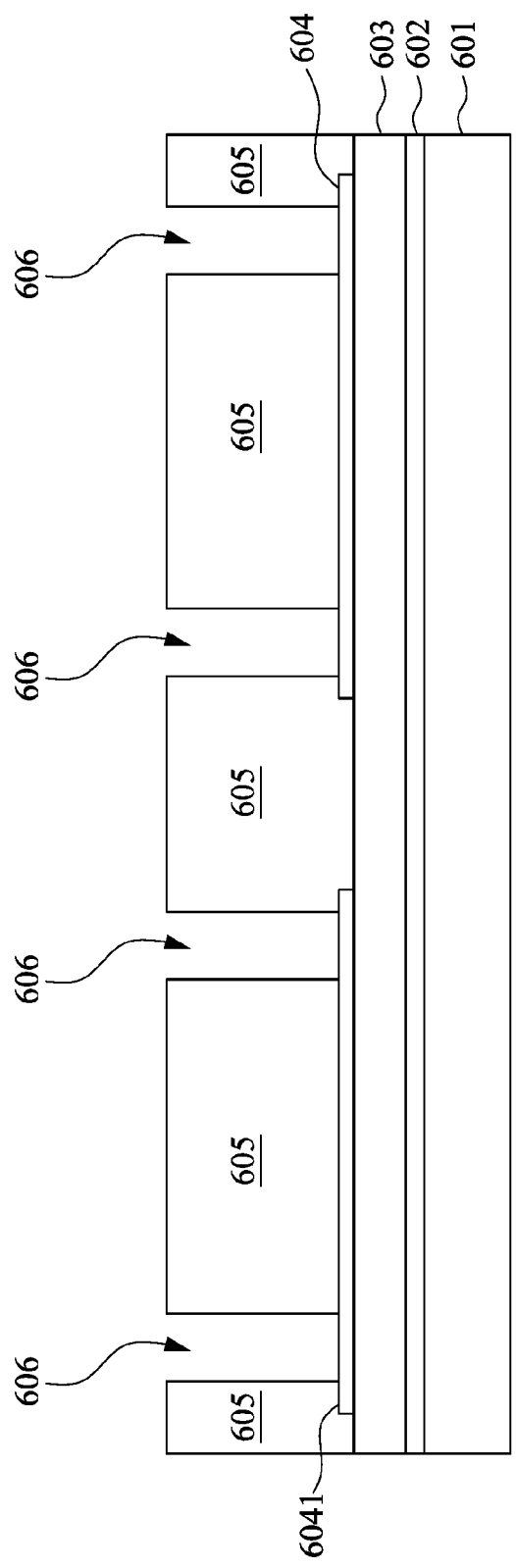

Next, in operation S430, a patterned photoresist 605 is formed over the backside RDL 604 and the carrier 601, as illustrated in FIG. 7. In some embodiments, for example, photoresist 605 is deposited as a blanket layer over backside RDL 604. Next, portions of photoresist 605 are exposed using a photo mask (not shown). Exposed or unexposed portions of photoresist 605 are then removed depending on whether a negative or positive resist is used. The resulting patterned photoresist 605 includes openings 606 disposed at peripheral areas of the carrier 601. In some embodiments, the openings 606 further expose conductive features 6041 in the backside RDL 604.

Figure 8:
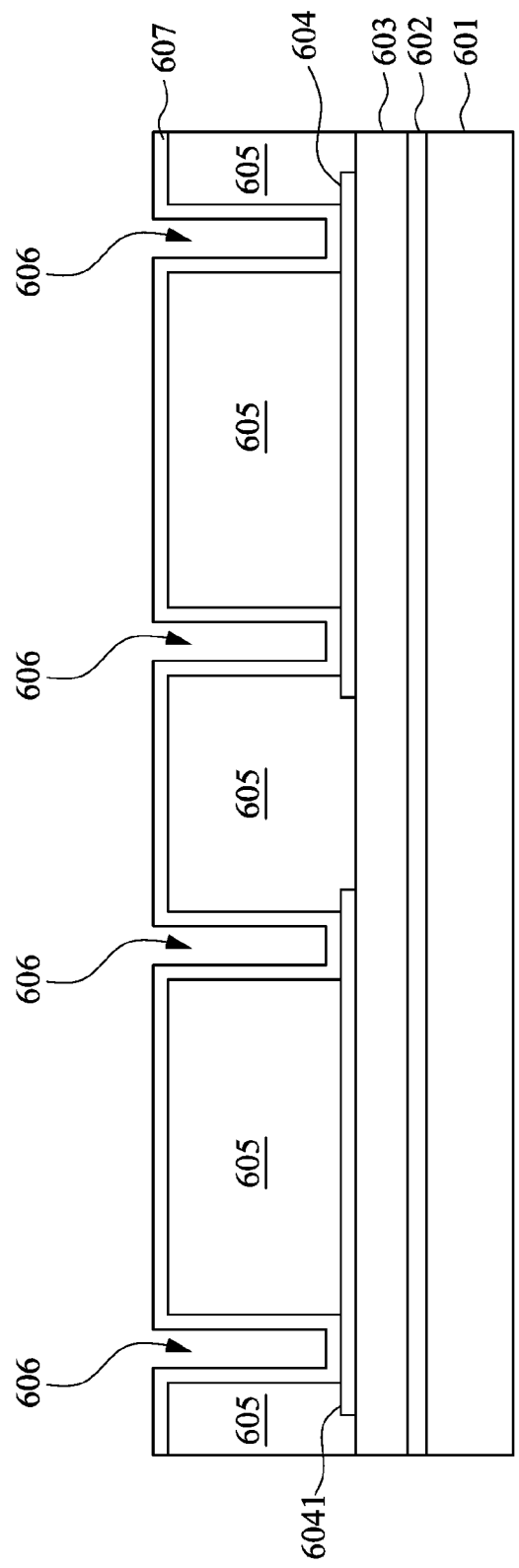

Next, in operation S440, a seed layer 607 is deposited overlying the patterned photoresist 605, as illustrated in FIG. 8.

Figure 9:
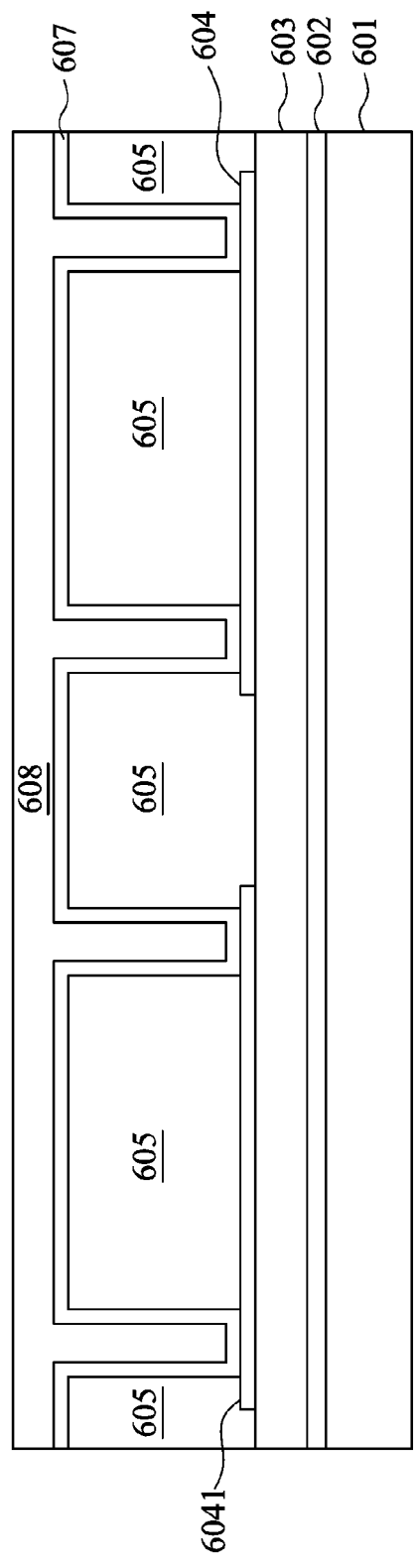
Figure 10:
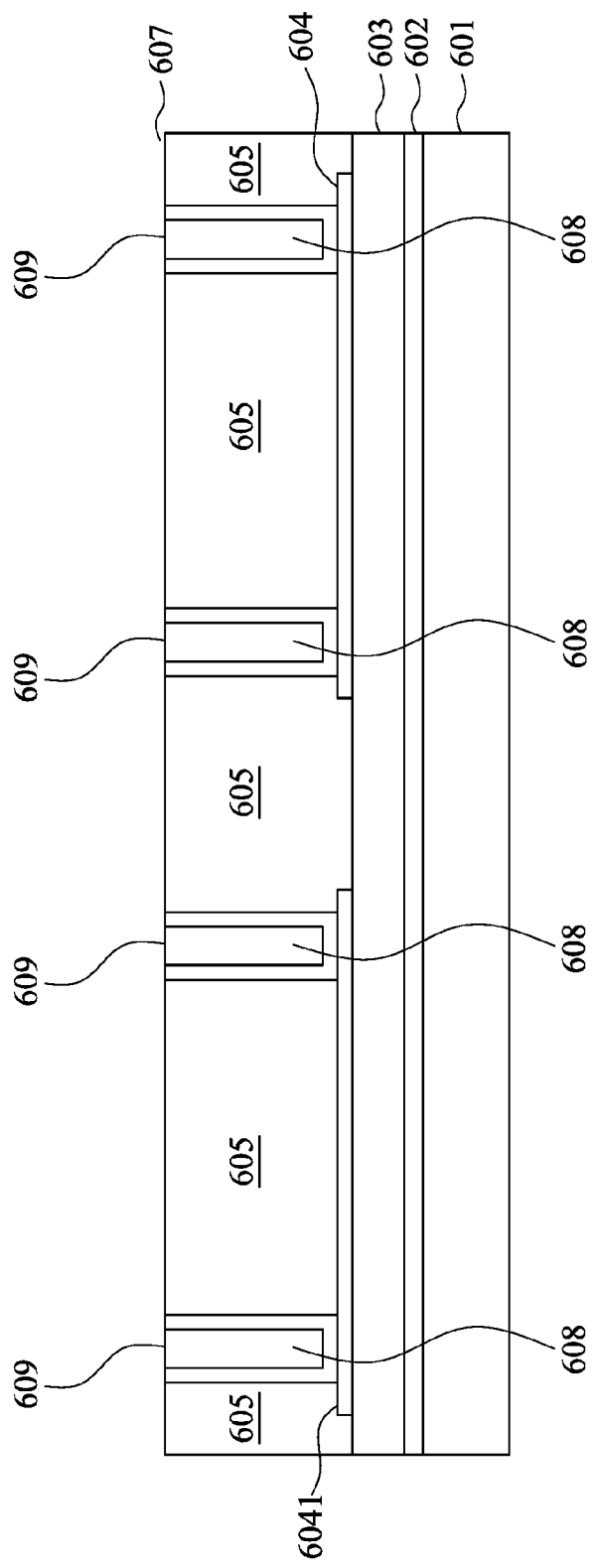

Next, in operation S450, the openings 606 are filled with a conductive material 608 including, for example, copper, silver, gold, and the like to form conductive vias, as illustrated in FIG. 9. In some embodiments, the openings 606 are plated with the conductive material 608 during a plating process, including, for example, electro-chemically plating, electroless plating, or the like. In some embodiments, the conductive material 608 overfills the openings 606, and a grinding and a chemical mechanical polishing (CMP) process are performed to remove excess portions of the conductive material 608 over the photoresist 605, as illustrated in FIG. 10.

Figure 11:
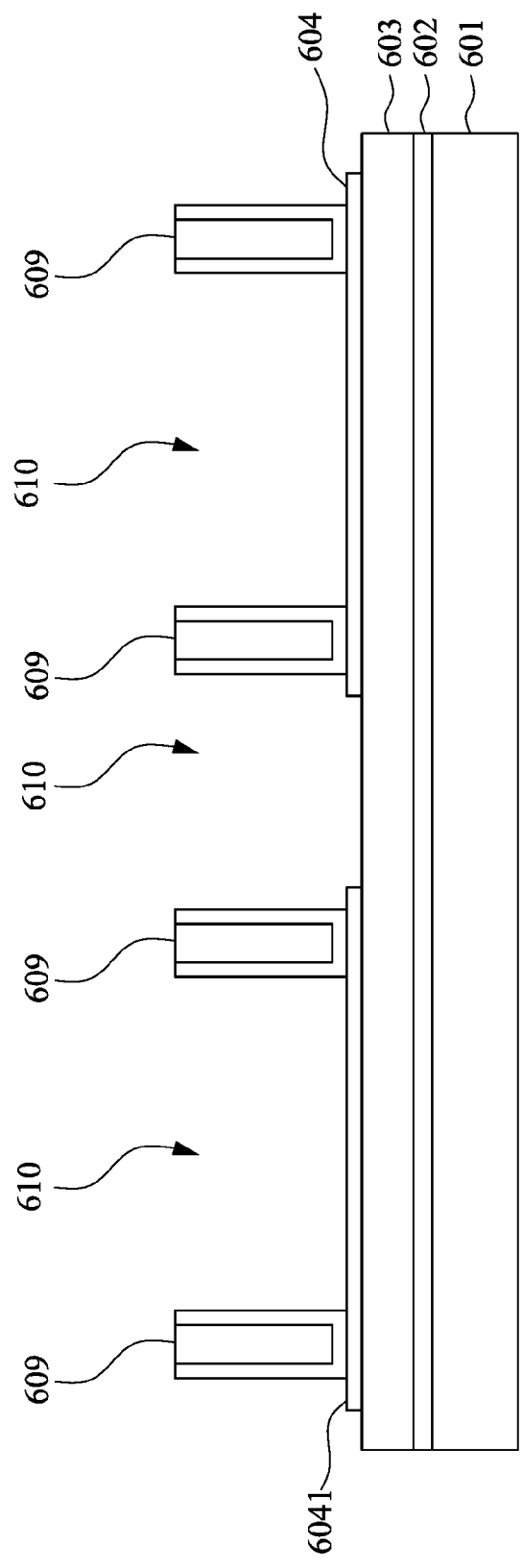

Next, in operation S460, the photoresist 605 is removed, as illustrated in FIG. 11. In some embodiments, a plasma ashing or wet strip process is used to remove the photoresist 605. In some embodiments, the plasma ashing process is followed by a wet dip in a sulfuric acid (H2SO4) solution to clean the package 500 and remove remaining photoresist material.

Thus, conductive vias 609 are formed over the backside RDL 604. Alternatively, in some embodiments, the conductive vias 609 are replaced with conductive studs or conductive wires, including, for example, copper, gold, or silver wire. In some embodiments, the conductive vias 609 are spaced apart from each other by openings 610, and at least one opening 610 between adjacent conductive vias 609 is large enough to dispose one or more semiconductor dies therein.

Figure 12:
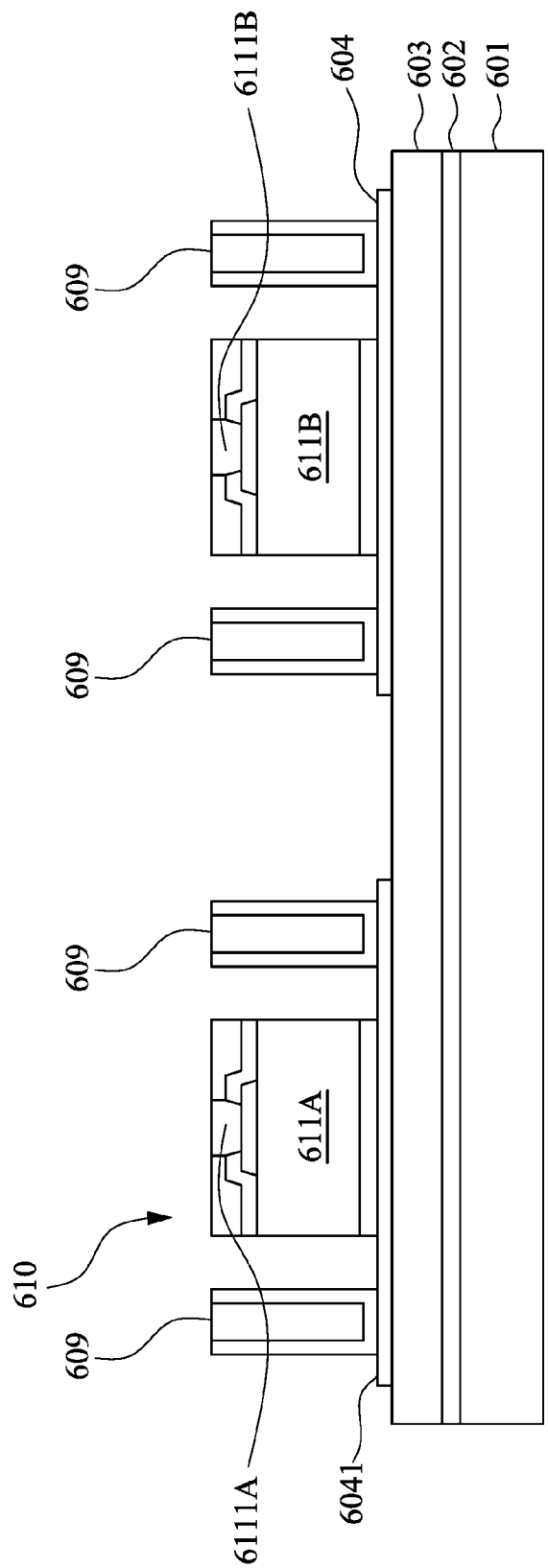

Next, in operation S470, a driver die 611A and a receiver die 611B are mounted and attached to the package 500, as illustrated in FIG. 12. For illustration, the device package 500 includes the carrier 601, and the backside redistribution layer 604 having conductive features 6041 as shown. In some embodiments, other interconnect structures including, for example, the conductive vias 609 electrically connected to the conductive features 6041 in the backside RDL 604 is also included. In some embodiments, an adhesive layer is used to affix the driver die 611A and the receiver die 611B to the backside RDL 604.

Figure 13:
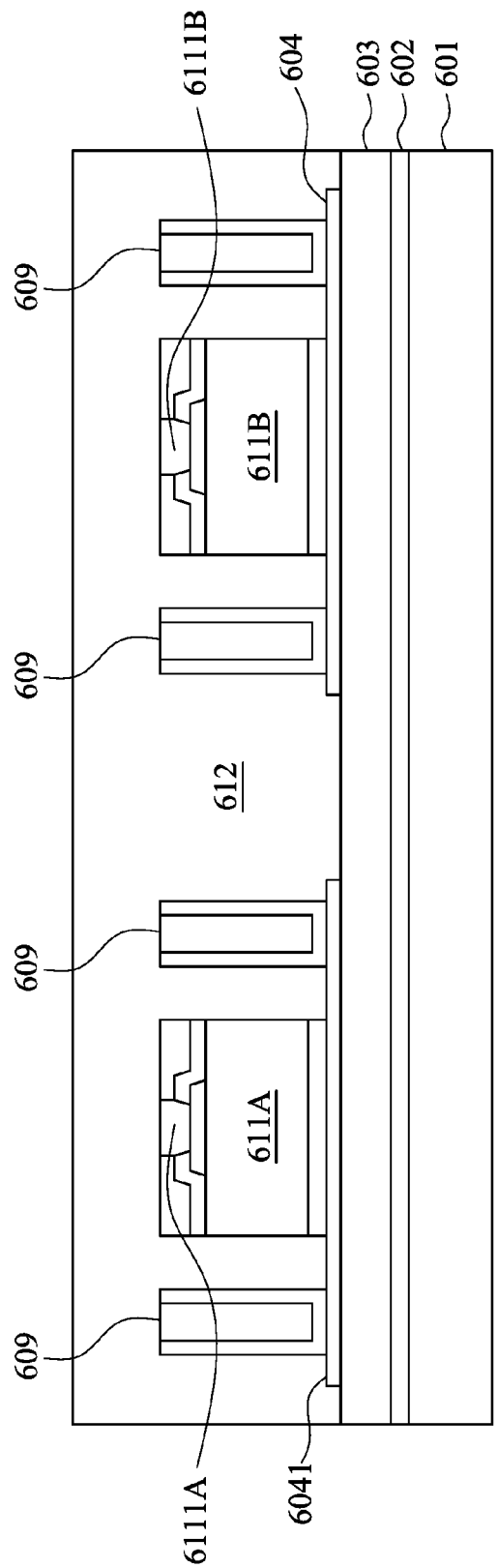

Next, in operation S480, a molding compound 612 is formed in the package 500 after the driver die 611A and the receiver die 611B are mounted to the backside RDL 604 in the opening 610, as illustrated in FIG. 13.

The molding compound 612 is dispensed to fill gaps between the driver die 611A and the conductive vias 609, gaps between the adjacent conductive vias 609, and gaps between the receiver die 611B and the conductive vias 609. In some embodiments, the molding compound 612 includes any suitable material including, for example, an epoxy resin, a molding underfill, or the like. In some embodiments, compressive molding, transfer molding, and liquid encapsulent molding are suitable methods for forming molding compound 612, but the present disclosure is not limited thereto. For example, molding compound 612 is dispensed between the driver die 611A, the receiver die 611B and the conductive vias 609 in liquid form. Subsequently, a curing process is performed to solidify molding compound 612. In some embodiments, the filling of molding compound 612 overflows the driver die 611A, the receiver die 611B, and conductive vias 609 so that the molding compound 612 covers top surfaces of the driver die 611A, the receiver die 611B and conductive vias 609.

Figure 14:
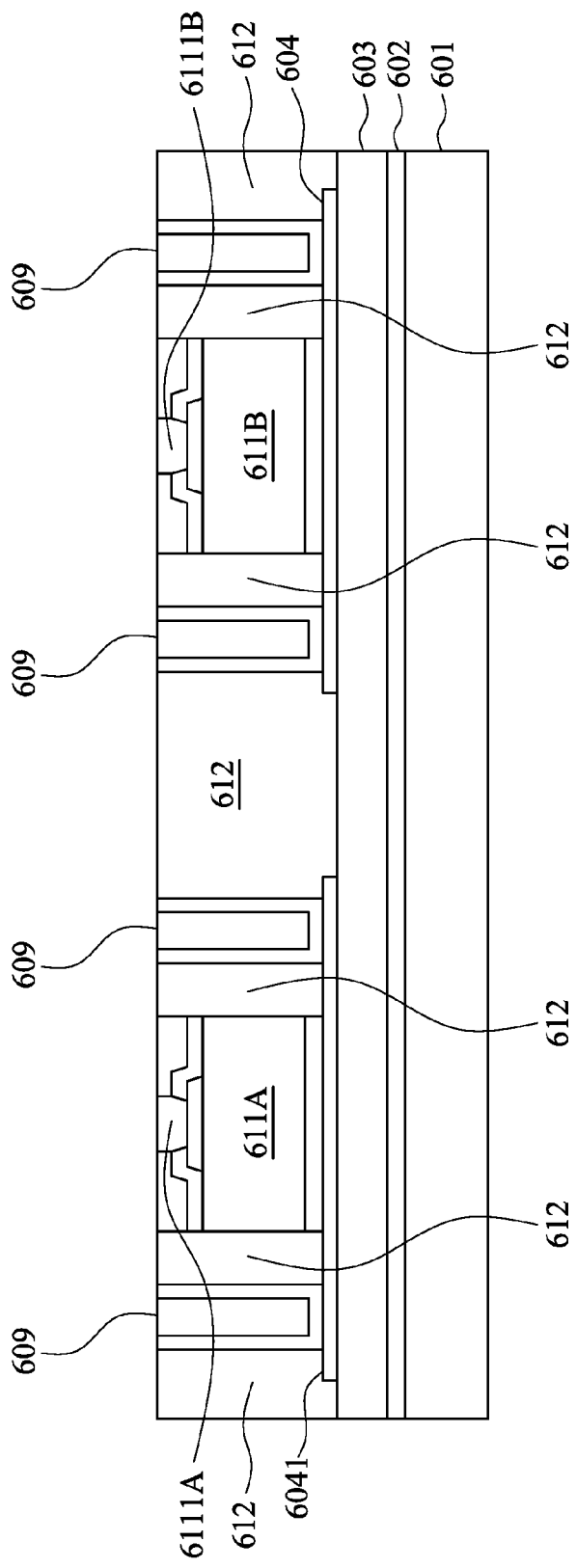

Next, in operation S490, a grinding and a chemical mechanical polishing (CMP) process are performed to remove excess portions of the molding compound 612, and the molding compound 612 is ground back to reduce its overall thickness and thus expose conductive vias 609, as illustrated in FIG. 14.

Because the resulting structure includes conductive vias 609 that extend through molding compound 612, conductive vias 609 is also referred to as through molding vias, through inter vias (TIVs), and the like. Conductive vias 609 provide electrical connections to the backside RDL 604 in the package 500. In some embodiments, the thinning process used to expose the conductive vias 609 is further used to expose conductive pillar 6111A and conductive pillar 6111B.

Figure 15:
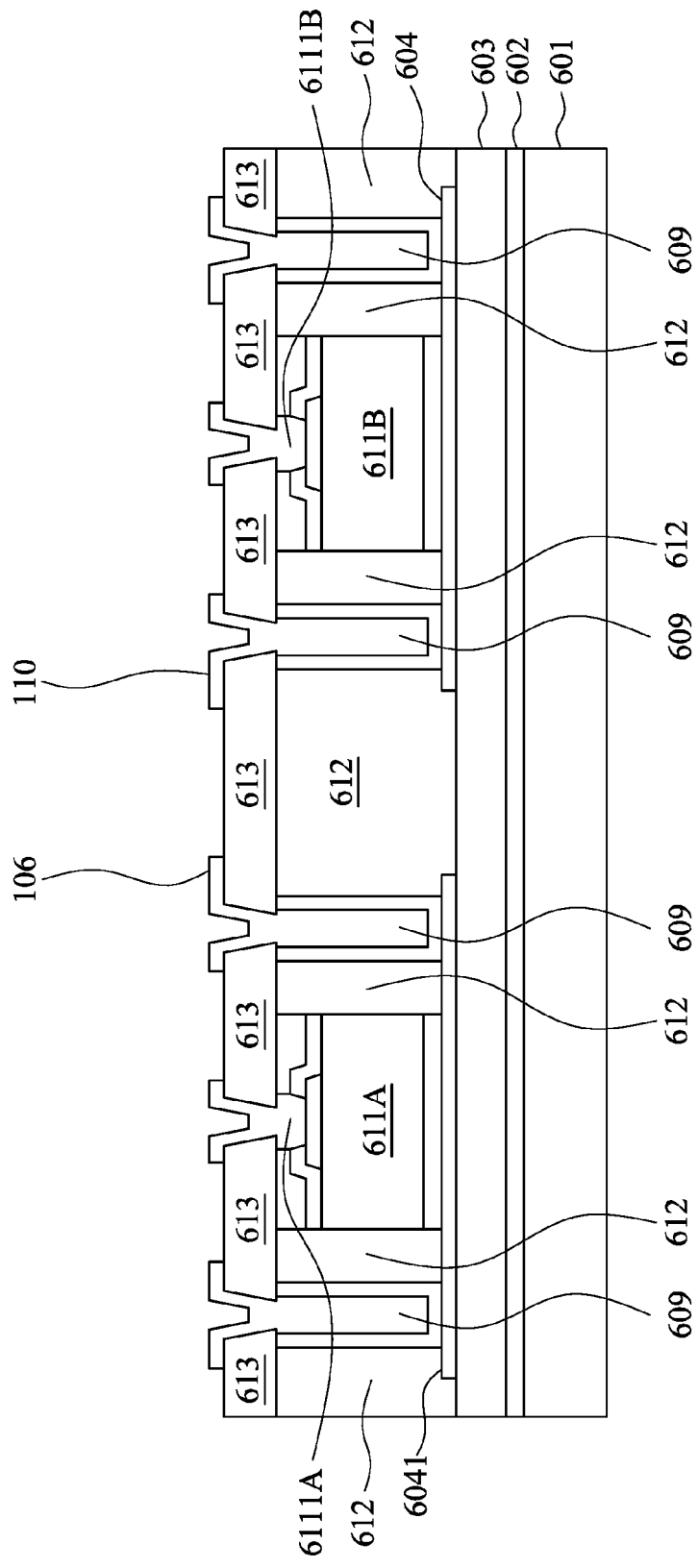

Next, in operation S500, a patterned polymer layer 613 having openings is formed overlying the molding compound 612, as illustrated in FIG. 15.

In some embodiments, the polymer layer 613 includes PI, PBO, BCB, epoxy, silicone, acrylates, nano-filled pheno resin, siloxane, a fluorinated polymer, polynorbornene, or the like. In some embodiments, the polymer layer 613 is selectively exposed to an etchant, including, for example, $CF_4$, $CHF_3$, $C_4F_8$, HF, etc., configured to etch the polymer layer 613 to form the openings. As illustratively shown, the openings expose the conductive pillar 6111A and 6111B, and the conductive vias 609. In some embodiments, the openings include one or more via holes, and an overlying metal wire trench. The via holes vertically extends from a bottom surface of the polymer layer 613 to a bottom surface of the metal trenches, which extend to a top surface of the polymer layer 613.

In some embodiments, the openings are filled with a conductive material, as illustratively shown. For example, a seed layer (not shown) is formed in the openings and the conductive material is plated in the openings using an electrochemical plating process, electroless plating process, or the like. The resulting via holes in the polymer layer 613 are electrically connected to the conductive pillar 6111A, the conductive pillar 6111B or the conductive vias 609, as illustratively shown, and the lower transmission electrode 106 and the lower receiver electrode 110 are formed within the polymer layer 613. In some embodiments, the polymer layer 613 is patterned to form openings, and a metal material is formed within the openings to form the lower transmission electrode 106 and the lower receiver electrode 110. In some embodiments, the transmission electrode 106 is laterally separated from the receiver electrode 110 by way of the polymer layer 613. The lower transmission electrode 106 and the lower receiver electrode 110 are electrically connected to the ground respectively through the conductive vias 609 and the backside RDL 604. In some embodiments, the conductive material, including, for example, copper, is deposited by way of a deposition process, a subsequent plating process, and a CMP process, as described above, and thus detailed description is omitted for brevity.

Figure 16:
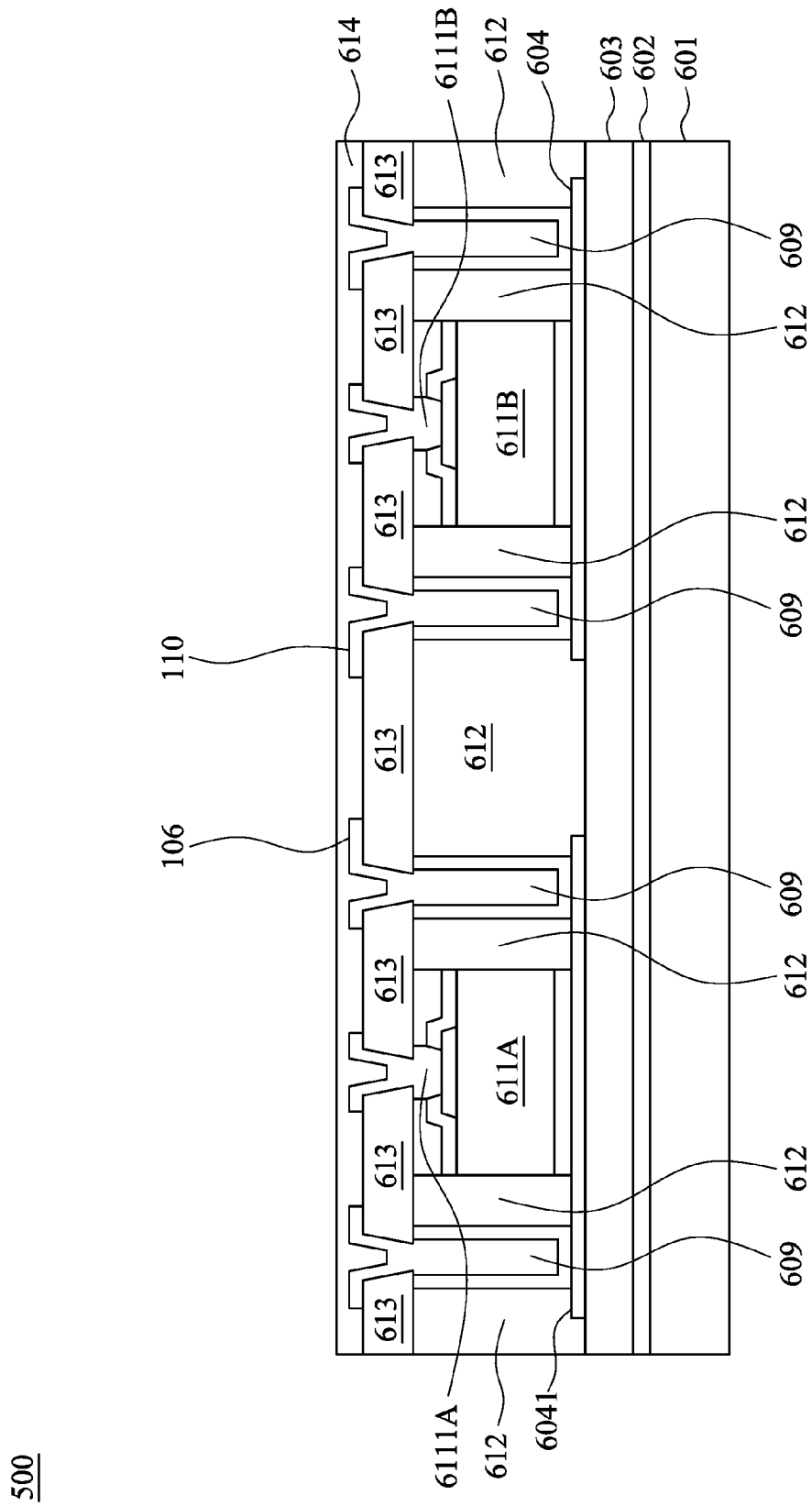

Next, in operation S510, a waveguide dielectric material 614 is formed overlying the polymer layer 613, as illustrated in FIG. 16. In some embodiments, the waveguide dielectric material 614 includes a higher dielectric constant than the surrounding polymer layers including, for example, the polymer layer 613 and 616 (shown in FIG. 21). In some embodiments, the waveguide dielectric material 614 is formed by way of a vapor deposition technique, including, for example, PVD, CVD, or PECVD, to a thickness that overlies the polymer layer 613. In some embodiments, a grinding and a chemical mechanical polishing (CMP) process are used to remove excess portions of the waveguide dielectric material 614.

In some embodiments, the waveguide dielectric material 614 includes room-temperature (e.g., 25° C.) liquid-phase high-K polymer, including, for example, PBO, PI, etc. In some other embodiments, the waveguide dielectric material 614 includes room-temperature or low-temperature (e.g., below 250° C.) liquid-phase $SiO_2$ or Spin on Glass (SOG), of which the dielectric constant is greater than or equal to approximately 4. In some other embodiments, the waveguide dielectric material 614 includes liquid phase $SiN_x$ or other high-K dielectric. In some other embodiments, the waveguide dielectric material 614 includes low-temperature (e.g., 180° C.) chemical vapor deposited $SiO_2$ (CVD-$SiO_2$), $SiN_x$ or $SiO_xN_y$ deposition, including, for example, atmospheric pressure CVD (APCVD), sub-atmospheric CVD (SACVD), plasma enhanced CVD (PECVD), metal organic CVD (MOCVD), etc. In some other embodiments, the waveguide dielectric material 614 includes low-temperature (e.g., 210° C.) high-K dielectric deposition including, for example, $ZrO_2$—$Al_2O_3$—$ZrO_2$ (ZAZ) or other High-K dielectric deposition including, for example, $ZrO_2$, $Al_2O_3$, $HfO_x$, $HfSiO_x$, $ZrTiO_x$, $TiO_2$, $TaO_x$, etc. In some other embodiments, the waveguide dielectric material 614 includes hybrid atomic layer deposited SrO (ALD-SrO) and chemical vapor deposited $RuO_2$ (CVD-$RuO_2$). For example, in some other embodiments, the waveguide dielectric material 614 includes a $SrTiO_3$ (STO) dielectric layer.

The aforementioned materials are given for illustrative purposes. Various materials of the waveguide dielectric material 614 are within the contemplated scoped of the present disclosure.

Next, after deposition, the waveguide dielectric material 614 is patterned to form the dielectric waveguide 101 using photolithography and/or etching processes. For illustration, in operation S520, a patterned photoresist 605b is formed over the waveguide dielectric material 614.

Figure 17:
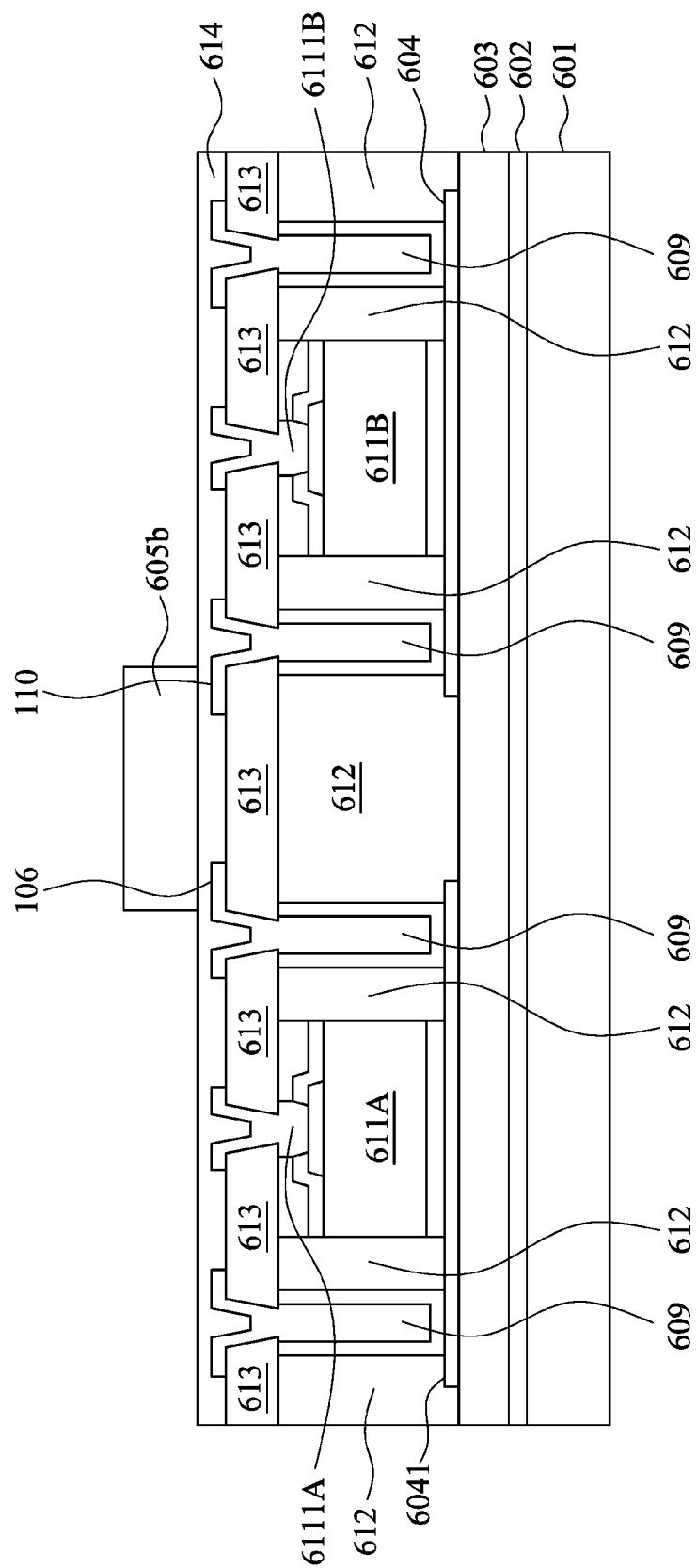

Next, portions of photoresist 605b are exposed using a photo mask (not shown). Exposed or unexposed portions of photoresist 605b are then removed depending on whether a negative or positive resist is used. The resulting patterned photoresist 605b includes portions disposed between the transmission electrode 106 and the receiver electrode 110, as illustrated in FIG. 17.

Figure 18:
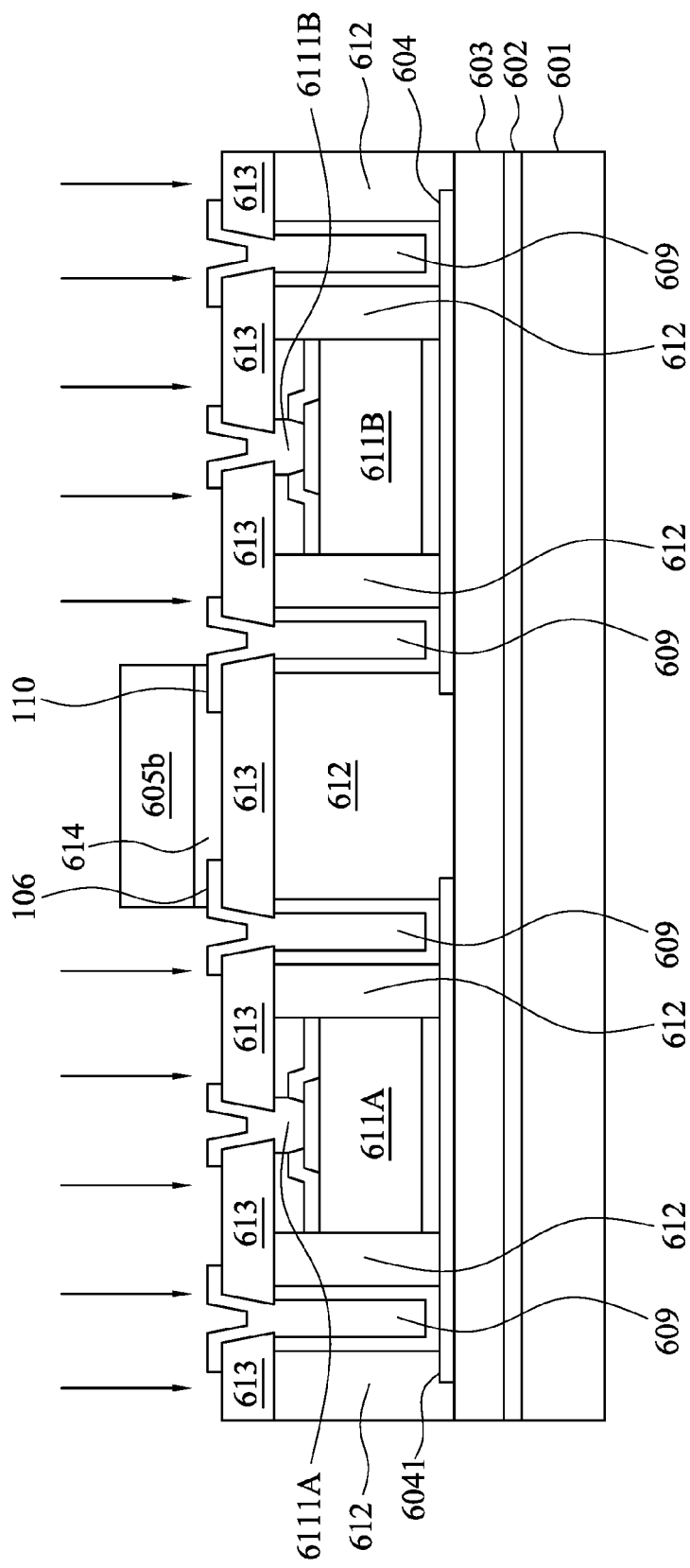

Next, in operation S530, an etching process is performed to remove the exposed portions of the waveguide dielectric material 614, as illustrated in FIG. 18. In some embodiments, the etching process includes a reactive ion etching (RIE), but the present disclosure is not limited thereto.

Figure 19:
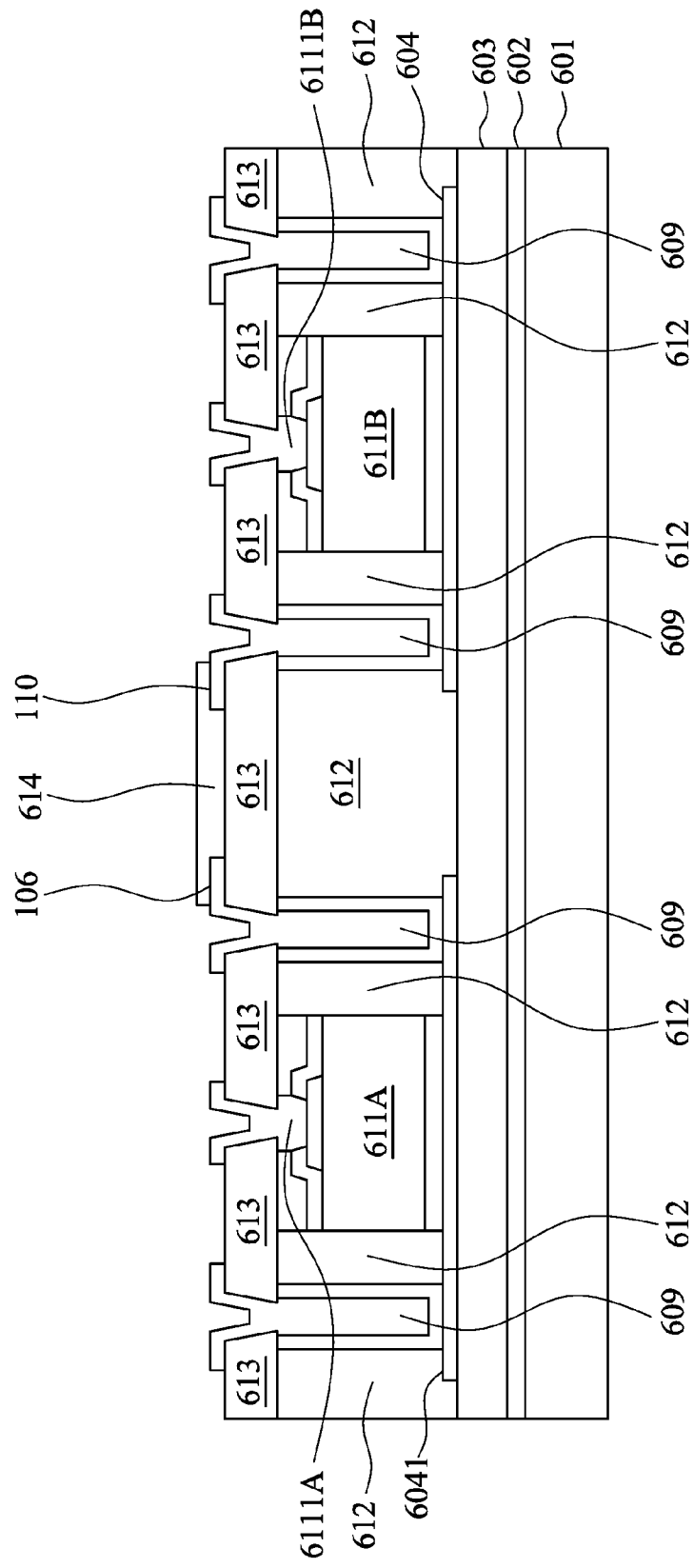

Next, in operation S540, photoresist 605b is removed, as illustrated in FIG. 19. In some embodiments, a plasma ashing or wet strip process is used to remove photoresist 605b. In some embodiments, the plasma ashing process is followed by a wet dip in a sulfuric acid (H2SO4) solution to clean package 500 and remove remaining photoresist material.

Figure 20:
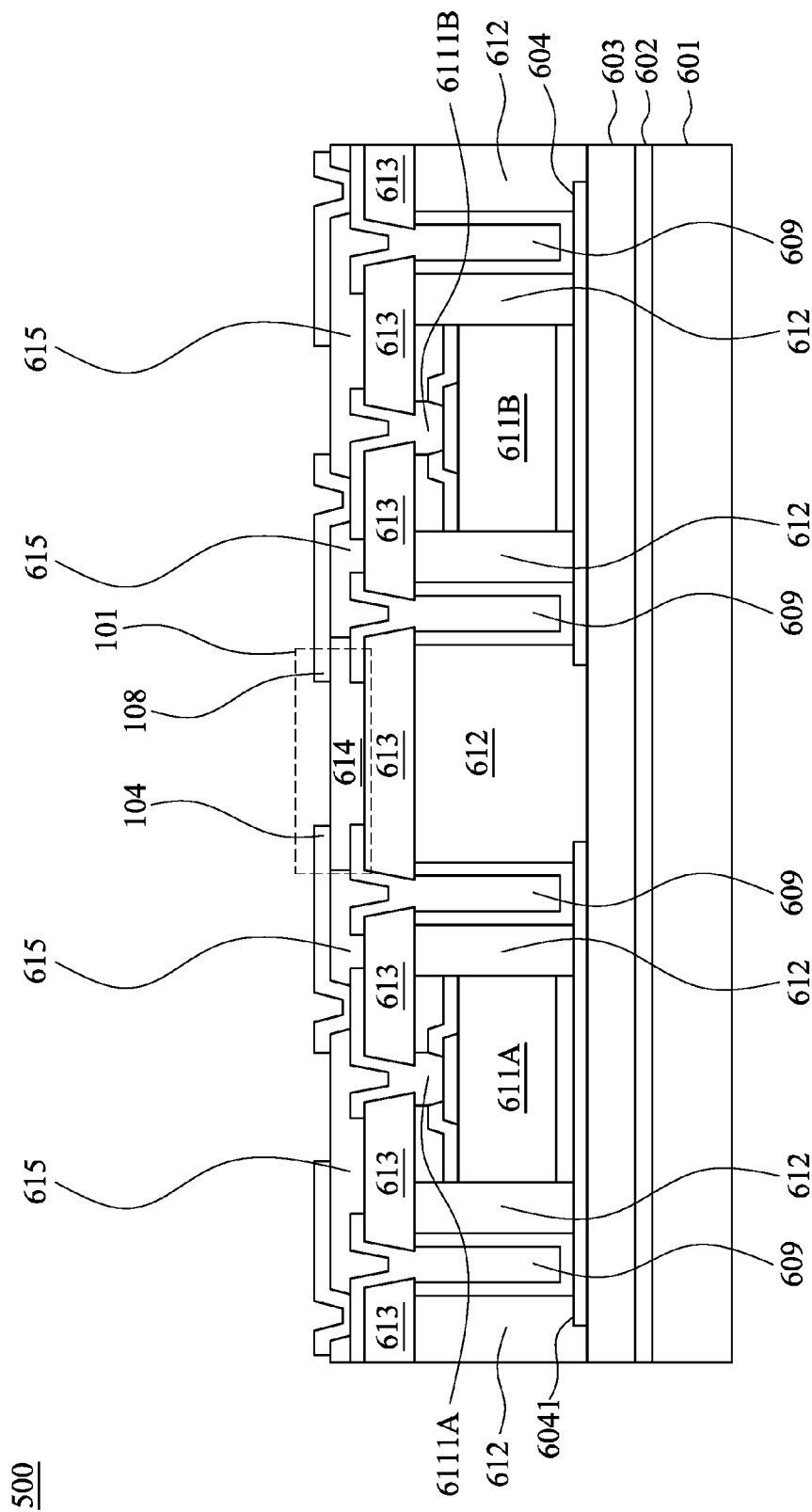

Next, in operation S550, a patterned polymer layer 615 having openings is formed overlying the polymer layer 613, as illustrated in FIG. 20. In some embodiments, the polymer layer 615 includes PI, PBO, BCB, epoxy, silicone, acrylates, nano-filled pheno resin, siloxane, a fluorinated polymer, polynorbornene, or the like. In some embodiments, the polymer layer 615 is selectively exposed to an etchant, including, for example, $CF_4$, $CHF_3$, $C_4F_8$, HF, etc., configured to etch the polymer layer 615 to form the openings. In some embodiments, the openings include one or more via holes, and an overlying metal wire trench. The via holes vertically extends from a bottom surface of the polymer layer 615 to a bottom surface of the metal trenches, which extend to a top surface of the polymer layer 615.

In some embodiments, the openings are filled with a conductive material. For illustration, a seed layer (not shown) is formed in the openings and the conductive material is plated in the openings using, for example, an electrochemical plating process, electroless plating process, or the like. The resulting via holes in the polymer layer 615 are electrically connected to the conductive pillar 6111A, the conductive pillar 6111B, or the conductive vias 609, as illustratively shown. In some embodiments, the conductive material, including, for example, copper, is deposited by way of a deposition process, a subsequent plating process, and a CMP process, as described above, and thus detailed description is omitted for brevity.

Figure 21:
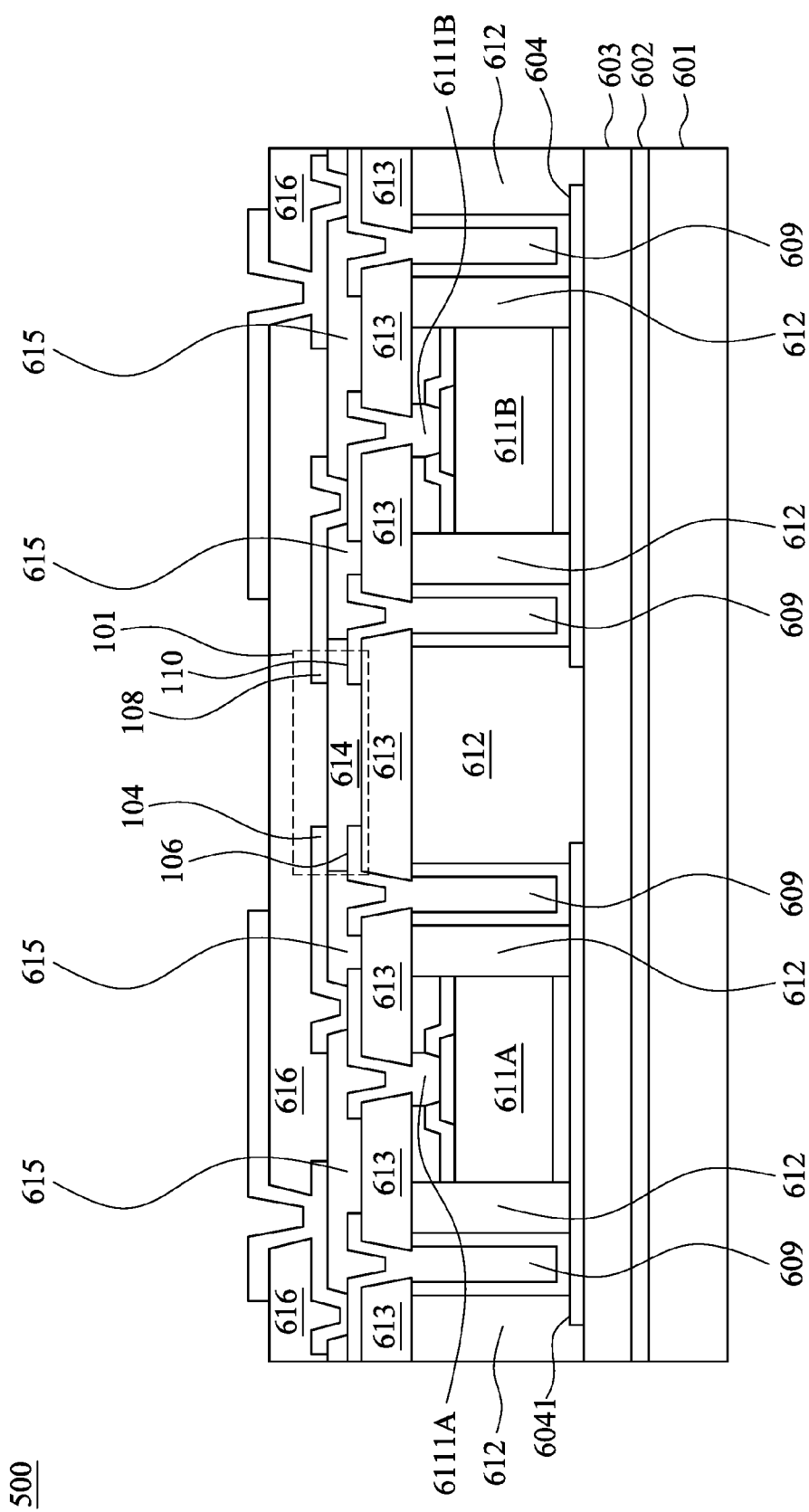

In some embodiments, one or more additional polymer layers 616 having conductive features are formed over the polymer layer 615, as illustrated in FIG. 21. In operation S560, RDLs having conductive features are formed in the polymer layer 616. In some embodiments, the RDLs include conductive features disposed between various polymer layers. As illustratively shown, the upper transmission electrode 104 and the upper receiver electrode 108 are formed within the polymer layer 616. In some embodiments, the polymer layer 616 is patterned to form openings, and a metal material is formed within the openings to form the upper transmission electrode 104 and the upper receiver electrode 108. In some embodiments, the transmission electrode 104 is laterally separated from the receiver electrode 108 by way of the polymer layer 616.

As illustratively shown, in some embodiments, the driver die 611A and the receiver die 611B are electrically connected to the upper transmission electrode 104 and the upper receiver electrode 108 respectively via the conductive features in the RDLs. The driver die 611A is electrically connected to the upper transmission electrode 104 through the conductive pillar 6111A and the conductive vias. The receiver die 611B is electrically connected to the upper receiver electrode 108 through the conductive pillar 6111B and the conductive vias. In some embodiments, the RDLs formed in the polymer layers are substantially similar to the backside RDL 604 both in composition and formation process, and thus detailed description is omitted for brevity.

Figure 22:
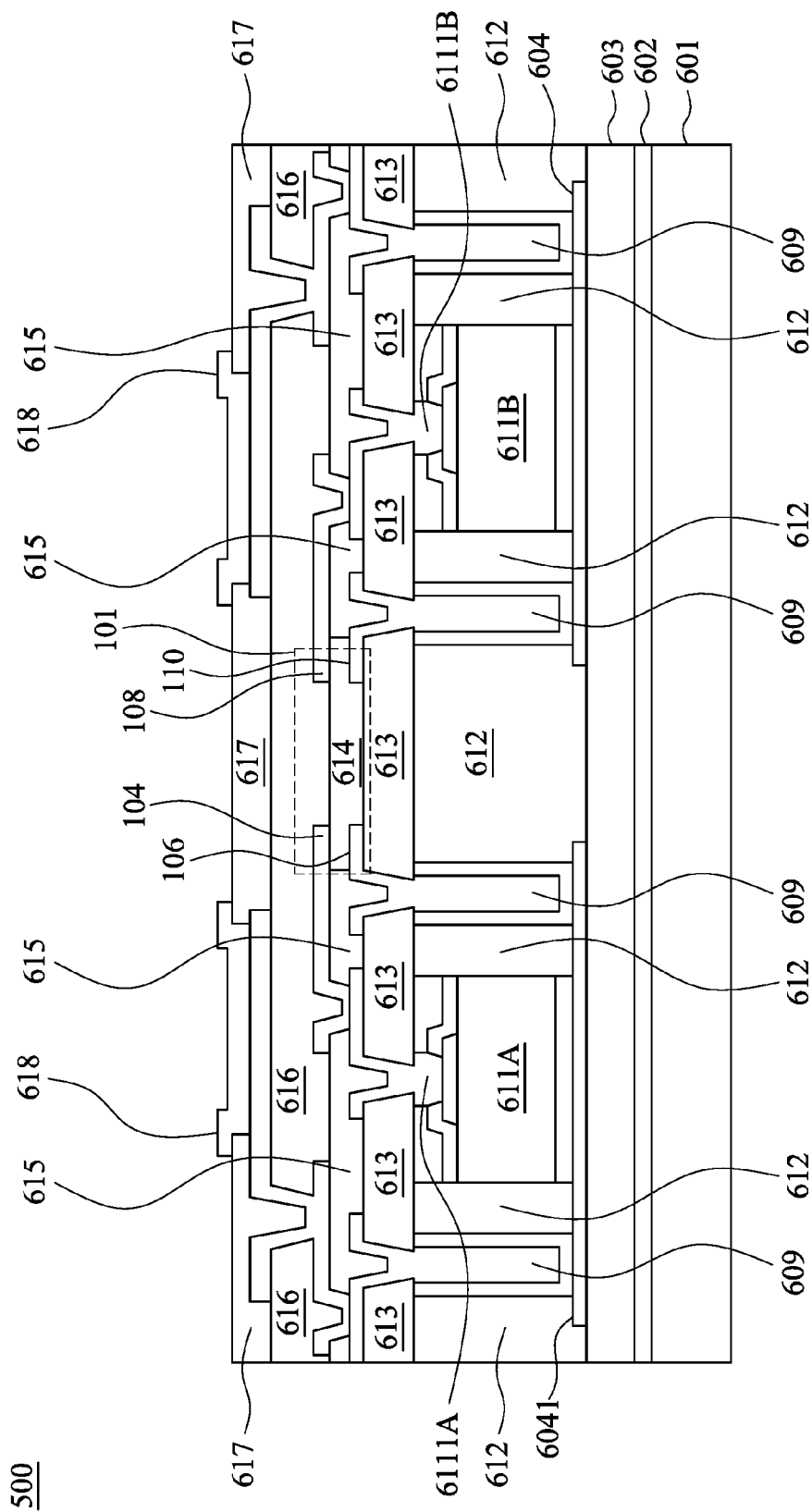
Figure 23:
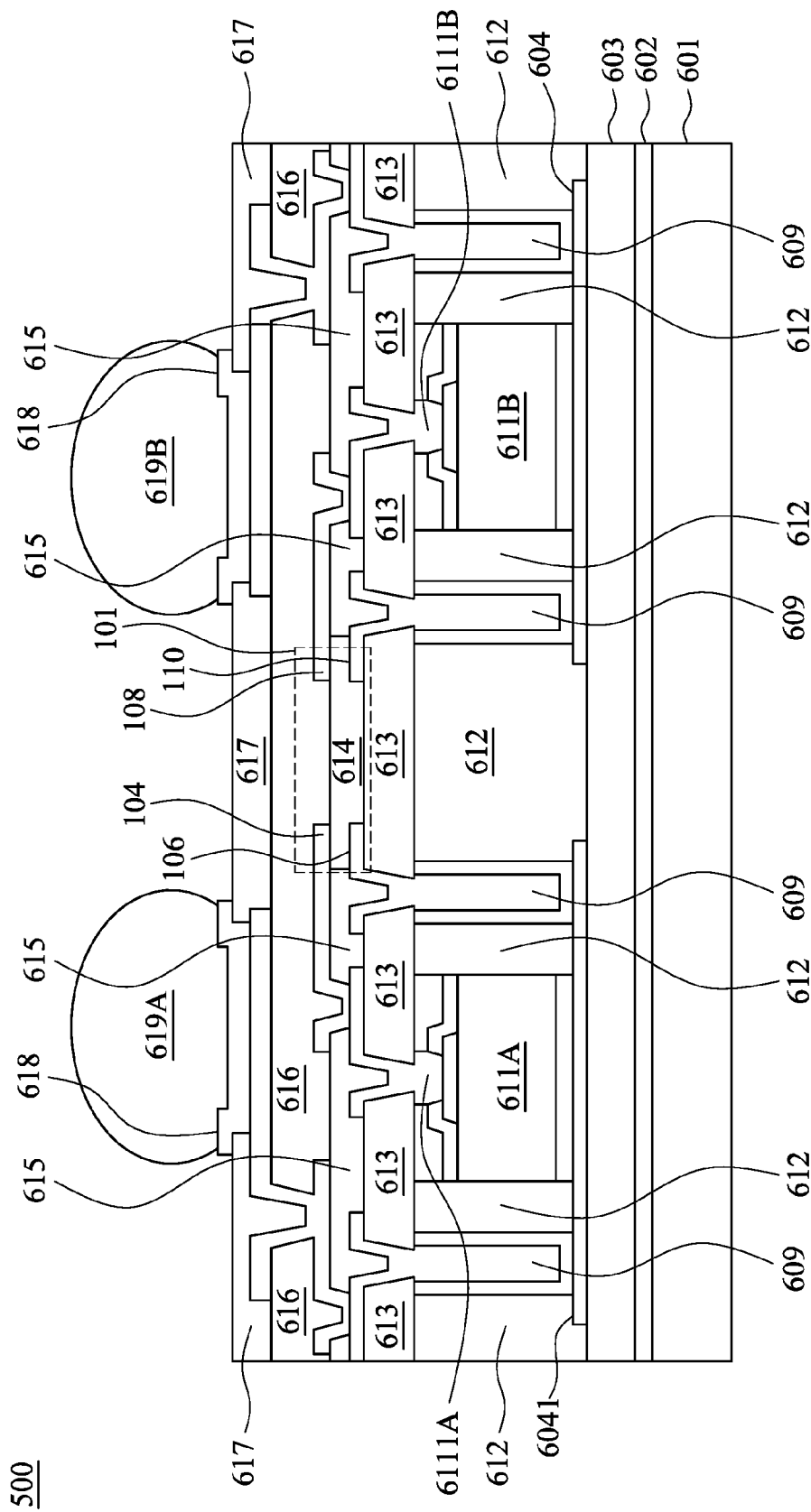

Next, in operation S570, Under Bump Metallurgies (UBMs) 618 are then formed to electrically connect to the lower transmission electrode 106 and the lower receiver electrode 110 through the RDLs in the polymer layer 616, and a polymer layer 617 is formed over the polymer layer 616, as illustrated in FIG. 22. External connectors 619A and 619B, which are configured to be the input/output (I/O) pads, including, for example, solder balls on Under Bump Metallurgies (UBMs) 618 are then formed as illustrated in FIG. 23. In some embodiments, the connectors 619A and 619B are ball grid array (BGA) balls, controlled collapse chip connector bumps, and the like disposed on UBMs 618, which are formed over the RDLs. In some embodiments, the connectors 619A and 619B are used to electrically connect package 500 to other package components including, for example, another device die, interposers, package substrates, printed circuit boards, a mother board, and the like. In some embodiments, the connector 619A is coupled to a transmission ground, and the connector 619B is coupled to a receiver ground. Thus, the lower transmission electrode 106 is coupled to the transmission ground via the conductive vias, RDLs 604 and 616, and the connector 619A. The lower receiver electrode 110 is coupled to the receiver ground via the conductive vias, RDLs 604 and 616, and the connector 619A.

Figure 24:
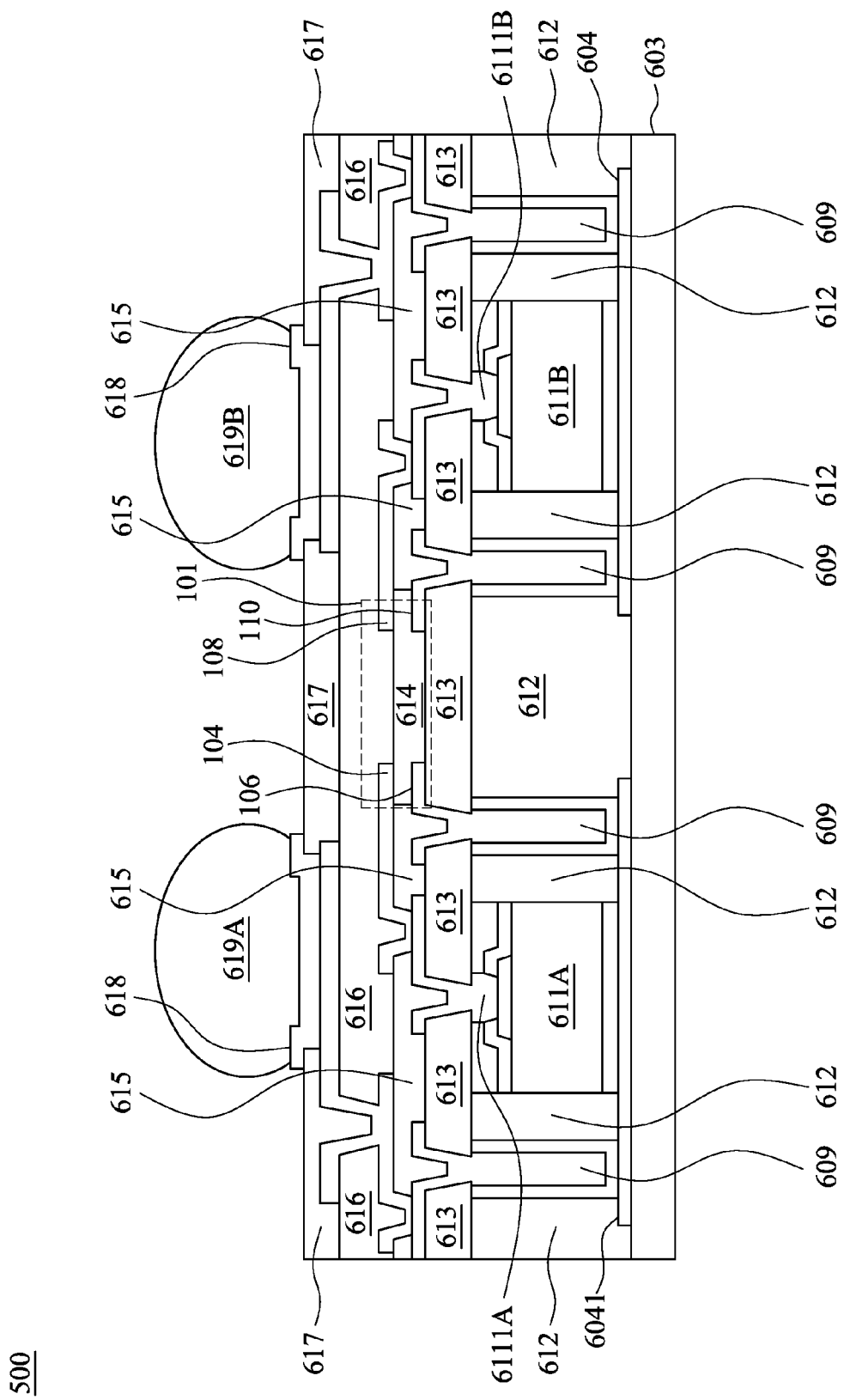

Next, the carrier 601 and adhesive layer 602 are removed from the package 500. The resulting structure is shown in FIG. 24. In some embodiments, the polymer base layer 603 is left in the resulting package 500 as an insulating and protective layer.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a semiconductor structure is disclosed that the semiconductor structure includes a dielectric waveguide vertically disposed between a first layer and a second layer, a driver die configured to generate, at a first output node, a driving signal, a first transmission electrode located along a first side of the dielectric waveguide and configured to receive the driving signal from the first output node, a first receiver electrode located along the first side of the dielectric waveguide, and a receiver die configured to receive a received signal from the first receiver electrode.

Also disclosed is a semiconductor structure that includes a dielectric waveguide having a substantially rectangular cross-sectional disposed between a first dielectric material and a second dielectric material, a first metal layer disposed along a first side of the dielectric waveguide, and a second metal layer disposed along a second side of the dielectric waveguide. The second dielectric material is disposed on a molding layer, and a driver die and a receiver die are surrounded by the molding layer.

Also disclosed is a method that includes attaching a driver die and a receiver die in a package; applying a molding compound to surround the driver die and the receiver die; forming a first layer over the driver die and the receiver die and the molding compound; forming a dielectric waveguide on the first layer; and forming a second layer on the dielectric waveguide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a dielectric waveguide vertically disposed between a first layer and a second layer;
   a driver die configured to generate, at a first output node, a driving signal;
   a first transmission electrode located along a first side of the dielectric waveguide and configured to receive the driving signal from the first output node;
   a first receiver electrode located along the first side of the dielectric waveguide;
   a second receiver electrode located along a second side of the dielectric waveguide and electrically coupled to a receiver ground, wherein the first receiver electrode and the second receiver electrode are mirror images; and
   a receiver die configured to receive a received signal from the first receiver electrode.

2. The semiconductor structure of claim 1, further comprising:
   a molding compound surrounding the driver die and the receiver die on a protection layer,
   wherein the first layer is disposed on the molding compound.

3. The semiconductor structure of claim 2, further comprising:
   a second transmission electrode located along the second side of the dielectric waveguide and electrically coupled to a transmission ground.

4. The semiconductor structure of claim 3,
   wherein the first transmission electrode comprises a first metal structure disposed over the dielectric waveguide, and the second transmission electrode comprises a second metal structure disposed below the dielectric waveguide; and
   wherein the first transmission electrode and the second transmission electrode are mirror images.

5. The semiconductor structure of claim 1,
   wherein the first receiver electrode comprises a first metal structure disposed over the dielectric waveguide, and the second receiver electrode comprises a second metal structure disposed below the dielectric waveguide.

6. The semiconductor structure of claim 1, wherein the dielectric waveguide comprises a dielectric material having a dielectric constant higher than those of the first layer and the second layer.

7. The semiconductor structure of claim 1, wherein the dielectric waveguide comprises polyimide or polybenzoxazole.

8. The semiconductor structure of claim 1, wherein the dielectric waveguide comprises silicon nitride or silicon dioxide.

9. The semiconductor structure of claim 1, wherein the dielectric waveguide comprises at least one of $ZrO_2$, $Al_2O_3$, HfOx, HfSiOx, ZrTiOx, $TiO_2$, and TaOx.

10. The semiconductor structure of claim 1, wherein the dielectric waveguide comprises a $SrTiO_3$ dielectric or a $ZrO_2$—$Al_2O_3$—$ZrO_2$ composite dielectric structure.

11. A semiconductor structure, comprising:
    a dielectric waveguide having a substantially rectangular cross-sectional disposed between a first dielectric material and a second dielectric material;
    a first metal layer disposed along a first side of the dielectric waveguide; and
    a second metal layer disposed along a second side of the dielectric waveguide,
    wherein the second dielectric material is disposed on a molding layer, and a driver die and a receiver die are surrounded by the molding layer,
    wherein a first receiver electrode is disposed within the first metal layer and coupled to the receiver die, a second receiver electrode is disposed within the second metal layer and coupled to a receiver ground, and the first receiver electrode and the second receiver electrode are mirror images.

12. The semiconductor structure of claim 11, wherein a first transmission electrode is disposed within the first metal layer, the first transmission electrode is coupled to the driver die, a second transmission electrode and a second receiver electrode are is disposed within the second metal layer, and the second transmission electrode is coupled to a transmission ground.

13. The semiconductor structure of claim 12, wherein a width of the dielectric waveguide is tapered from a first width to a second width in a transition region underlying the first transmission electrode, and the second width is narrower than the first width.

14. The semiconductor structure of claim 11, wherein the dielectric waveguide comprises a waveguide dielectric material having a higher dielectric constant than that of the first dielectric material and the second dielectric material.

15. The semiconductor structure of claim 11, further comprising:

a first plurality of transmission electrodes disposed within the first metal layer above the dielectric waveguide and coupled to a plurality of output nodes of the driver die; and a second plurality of transmission electrodes disposed within the second metal layer under the dielectric waveguide and coupled to a transmission ground.

16. A method, comprising:

attaching a driver die and a receiver die in a package;

applying a molding compound to surround the driver die and the receiver die;

forming a first layer over the driver die, the receiver die, and the molding compound;

forming a dielectric waveguide on the first layer;

forming a second layer on the dielectric waveguide; and forming a first receiver electrode and a second receiver electrode located along a first side and a second side of the dielectric waveguide respectively, wherein the first receiver electrode is formed to be coupled to the receiver die, and the second receiver electrode is formed to be coupled to a receiver ground, wherein the first receiver electrode and the second receiver electrode are mirror images.

17. The method of claim 16, further comprising:

forming a first transmission electrode located along the first side of the dielectric waveguide;

forming a second transmission electrode located along the second side of the dielectric waveguide and electrically coupled to a transmission ground; and wherein the driver die comprises an output node configured to provide a transmission signal to the first transmission electrode.

18. The method of claim 17, wherein the receiver die is configured to receive a received signal from the first receiver electrode.

19. The method of claim 18, further comprising:

patterning the first layer to form a first plurality of openings;

forming a first metal material within the first plurality of openings to form the second transmission electrode and the second receiver electrode;

patterning a waveguide layer overlying the first layer to form a dielectric waveguide opening;

forming a waveguide dielectric material within the dielectric waveguide opening to form the dielectric waveguide;

patterning the second layer overlying the waveguide layer to form a second plurality of openings; and forming a second metal material within the second plurality of openings to form the first transmission electrode and the first receiver electrode.

20. The semiconductor structure of claim 1, wherein the first transmission electrode is coupled with the dielectric waveguide at a transition region, wherein, in the transition region, a width of the first transmission electrode or a width the dielectric waveguide is tapered from a first width to a second width.

* * * * *